United States Patent
Stoffels et al.

(10) Patent No.: US 11,380,789 B2
(45) Date of Patent: Jul. 5, 2022

(54) GROUP III-NITRIDE BASED VERTICAL POWER DEVICE AND SYSTEM

(71) Applicant: IMEC VZW, Leuven (BE)

(72) Inventors: Steve Stoffels, Haasrode (BE); Stefaan Decoutere, Haasrode (BE)

(73) Assignee: IMEC VZW, Leuven (BE)

( * ) Notice: Subject to any disclaimer, the term of this patent is extended or adjusted under 35 U.S.C. 154(b) by 12 days.

(21) Appl. No.: 16/750,711

(22) Filed: Jan. 23, 2020

(65) Prior Publication Data
US 2020/0243678 A1    Jul. 30, 2020

(30) Foreign Application Priority Data
Jan. 24, 2019 (EP) ..................... 19153573

(51) Int. Cl.
*H01L 29/78* (2006.01)
*H01L 29/778* (2006.01)
(Continued)

(52) U.S. Cl.
CPC ...... *H01L 29/7813* (2013.01); *H01L 21/8252* (2013.01); *H01L 29/7788* (2013.01); *H01L 29/2003* (2013.01)

(58) Field of Classification Search
CPC .......... H01L 29/7788; H01L 29/2003; H01L 29/7813; H01L 29/4236; H01L 29/42352;
(Continued)

(56) References Cited

U.S. PATENT DOCUMENTS

| | | | | |
|---|---|---|---|---|
| 8,598,655 B1 * | 12/2013 | Schloesser | ...... | H01L 21/823487 257/334 |
| 2004/0070047 A1 * | 4/2004 | Majumdar | ............ | H01L 27/088 257/510 |

(Continued)

FOREIGN PATENT DOCUMENTS

WO    2008/093824 A1    8/2008

OTHER PUBLICATIONS

Lu, Xing, Chao Liu, Huaxing Jiang, Xinbo Zou, Anping Zhang, and Kei May Lau. "Monolithic integration of enhancement-mode vertical driving transistorson a standard InGaN/GaN light emitting diode structure." Applied Physics Letters 109, No. 5 (2016): 053504.
(Continued)

*Primary Examiner* — Natalia A Gondarenko
(74) *Attorney, Agent, or Firm* — McDonnell Boehnen Hulbert & Berghoff LLP

(57) ABSTRACT

A vertical power device is disclosed, the device having a top side and a bottom side, and the device comprising (i) a substrate; (ii) a layered group III-Nitride based device stack formed atop the substrate; (iii) a first vertical group III-Nitride based device and a second vertical group III-Nitride based device formed in the group III-Nitride based device stack, wherein the first vertical group III-Nitride based device and the second vertical group III-Nitride based device are electrically connected; and (iv) a first vertical device isolation structure that isolates the first vertical group III-Nitride based device from the second vertical group III-Nitride based device. Also disclosed are a vertical power system integrating vertical power devices and a process for fabricating a vertical power device.

20 Claims, 14 Drawing Sheets

(51) Int. Cl.
*H01L 21/8252* (2006.01)
*H01L 29/20* (2006.01)

(58) Field of Classification Search
CPC ....... H01L 29/66613–66628; H01L 29/66666;
H01L 29/66712–66734; H01L
29/7802–7815; H01L 29/78642; H01L
27/0203; H01L 27/0218; H01L 27/0605;
H01L 27/0611; H01L 27/0629; H01L
27/0617; H01L 27/088; H01L 27/095;
H01L 2027/11859; H01L 2027/11831;
H01L 2027/11803; H01L 2027/11861;
H01L 2027/11862; H01L 2027/11866;
H01L 2027/11875; H01L
2924/351–35121; H01L 21/823481; H01L
21/823487; H01L 21/8252;
H01L 21/823475; H01L 21/76895; H01L
21/76831; H01L 21/76205–7621; H01L
21/76224–76237; H01L 21/76283–76286;
H01L 21/76805; H01L 2221/10–1094
USPC ....... 438/270, 154, 199, 459, 197, 455, 639;
257/299–342
See application file for complete search history.

(56) References Cited

U.S. PATENT DOCUMENTS

| | | |
|---|---|---|
| 2008/0135932 A1 | 6/2008 | Ozeki et al. |
| 2011/0006345 A1* | 1/2011 | Ota .................. H01L 29/66462 257/192 |
| 2011/0204381 A1 | 8/2011 | Okada et al. |
| 2013/0221433 A1 | 8/2013 | Molin et al. |
| 2014/0015586 A1 | 1/2014 | Hirler et al. |
| 2017/0092777 A1* | 3/2017 | Vielemeyer ....... H01L 29/41741 |
| 2017/0125574 A1* | 5/2017 | Chowdhury ........ H01L 29/2003 |

OTHER PUBLICATIONS

Liu, Chao, Riyaz Abdul Khadar, and Elison Matioli. "Vertical GaN-on-Si MOSFETs with monolithically integrated freewheeling Schottky barrier diodes." IEEE Electron Device Letters 39, No. 7 (2018): 1034-1037.

Li, Xiangdong, Marleen Van Hove, Ming Zhao, Karen Geens, Vesa-Pekka Lempinen, Jaakko Sormunen, Guido Groeseneken, and Stefaan Decoutere. "200 V enhancement-mode p-GaN HEMTs fabricated on 200 mm GaN-on-SOI with trench isolation for monolithic integration." IEEE Electron Device Letters 38, No. 7 (2017): 918-921.

Kang, Chang-Mo, Seok-Jin Kang, Seung-Hyun Mun, Soo-Young Choi, Jung-Hong Min, Sanghyeon Kim, Jae-Phil Shim, and Dong-Seon Lee. "Monolithic integration of AlGaInP-based red and InGaN-based green LEDs via adhesive bonding for multicolor emission." Scientific reports 7, No. 1 (2017): 1-9.

Lu, Xing, Chao Liu, Huaxing Jiang, Xinbo Zou, and Kei May Lau. "High performance monolithically integrated GaN driving VMOSFET on LED." IEEE Electron Device Letters 38, No. 6 (2017): 752-755.

Lee, Ya-Ju, Zu-Po Yang, Pin-Guang Chen, Yung-An Hsieh, Yung-Chi Yao, Ming-Han Liao, Min-Hung Lee, Mei-Tan Wang, and Jung-Min Hwang. "Monolithic integration of GaN-based light-emitting diodes and metal-oxide-semiconductor field-effect transistors." Optics express 22, No. 106 (2014): A1589-A1595.

European Search Report, European Application No. 19153573.1, dated Jul. 10, 2019, 9 pages.

* cited by examiner

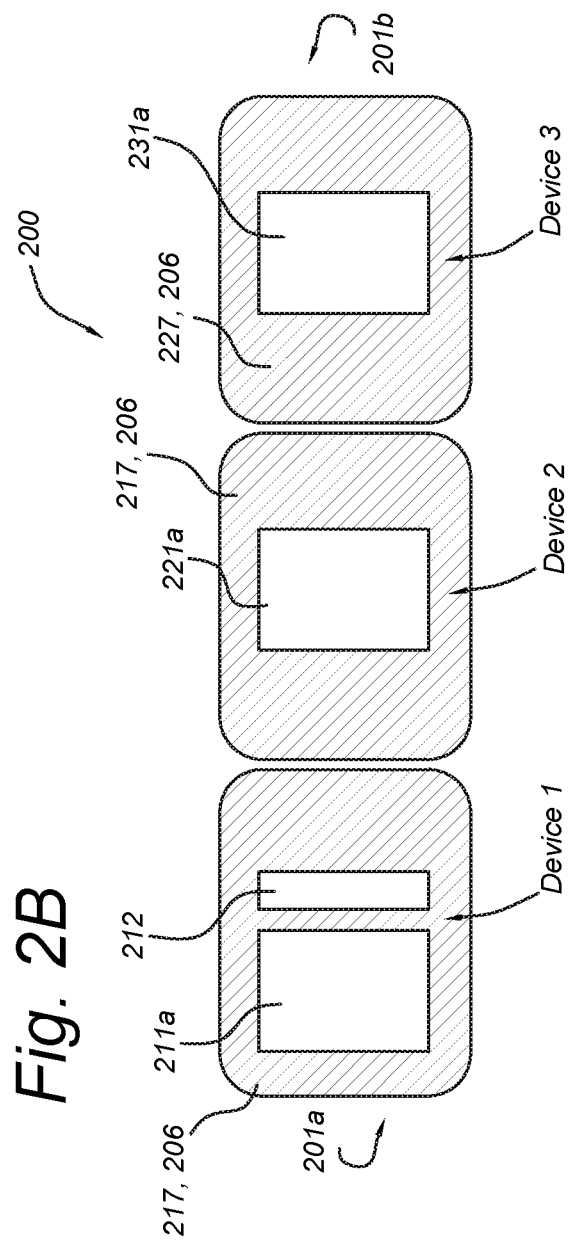

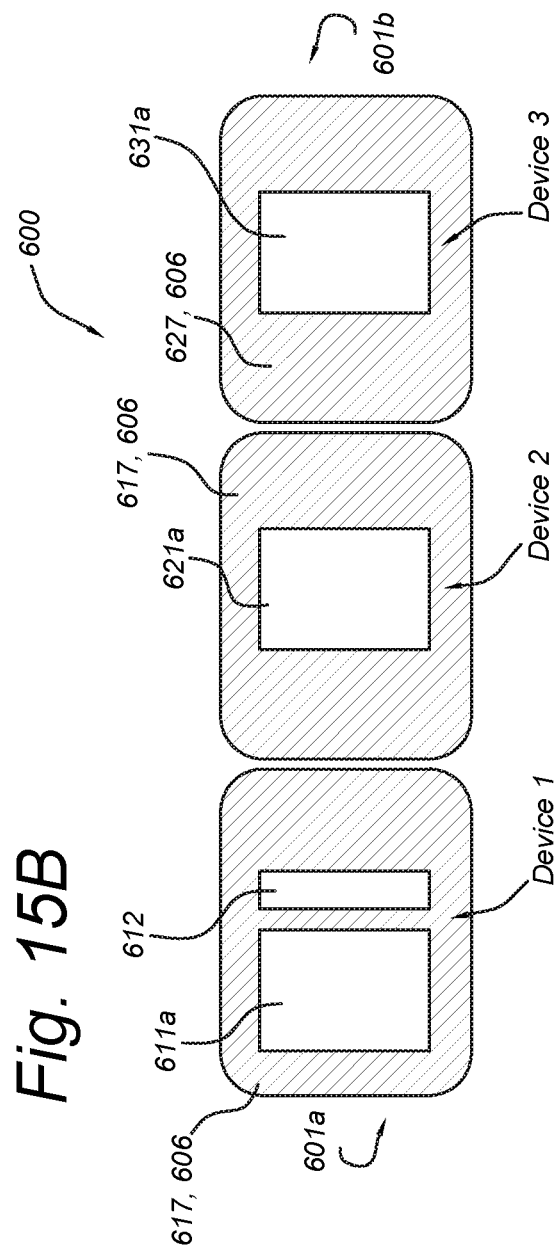

GROUP III-NITRIDE BASED VERTICAL POWER DEVICE AND SYSTEM

CROSS-REFERENCE TO RELATED APPLICATION

The present application is a non-provisional patent application claiming priority to European Patent Application No. 19153573.1 filed Jan. 24, 2019, the contents of which are hereby incorporated by reference.

TECHNICAL FIELD

The present disclosure is directed, in general, to a vertical power device, and, more specifically, to a group III-Nitride based vertical power device. The present disclosure further relates to a vertical power device system and a fabrication process.

BACKGROUND

In recent years, the integration of power devices has seen increasing demand in electronic power applications due to the possibility of achieving small scale power systems with orders of magnitude increase in switching speeds. With the rise of popularity of new materials, such as group III-Nitride based materials, some of these limitations may be overcome. Gallium nitride (GaN) is one of the most common group III-Nitride based materials which offers drastic reduction in energy consumption, reduction in size, weight, and cost, and increase in power conversion performance. However, conventional technologies and methods still have their limitations in the integration of power devices, such as high cost and inefficiency.

Monolithic integration technology has enabled the fabrication of power devices with various GaN devices. Several research studies have reported on monolithic integration of GaN components. These studies described the use of an isolating substrate for isolating the power devices and the use of trenches for creating contacts to connect the power devices.

Furthermore, lateral devices have been used in such integration, wherein the contacts of the lateral devices are accessible from one side. However, for a vertical device the terminals of the devices which need to be interconnected can be located on opposite sides of the substrate, making integration of vertical devices less trivial.

Therefore, there is a need in the art to provide a more reliable and efficient device that integrates group III-Nitride based devices in the same vertical power device.

SUMMARY

The present disclosure provides an improved vertical power device and system which do not show one or more of the above-mentioned disadvantages.

Additional and alternative aspects of the disclosure may be understood from the following.

An aspect of the present disclosure provides a vertical power device having a top side and a bottom side, the vertical power device comprising (i) a substrate; (ii) a layered group III-Nitride based device stack formed atop the substrate, the group III-Nitride based device stack comprising a body layer of a first conduction type between a lower layer and an upper layer of a second conduction type; and (iii) a first vertical group III-Nitride based device and a second vertical group III-Nitride based device formed in the group III-Nitride based device stack wherein the first vertical group III-Nitride based device and the second vertical group III-Nitride based device are electrically connected, the first vertical group III-Nitride based device comprising a first top contact and a first bottom contact, and the second vertical group III-Nitride based device comprising a second top contact and a second bottom contact, the first and second top contacts being formed at the top side, and the first and second bottom contacts being formed at the bottom side.

The vertical power device further comprises a first vertical device isolation structure that isolates the first vertical group III-Nitride based device from the second vertical group III-Nitride based device. Such integration of high power and high speed switching devices on a single vertical power device has several advantages. As a result of forming the contacts of the vertical group III-Nitride based devices at the top and bottom of the vertical power device, the vertical group III-Nitride based devices may be efficiently integrated on the vertical power device, wherein the top and bottom contacts can be clearly located on opposite sides of the vertical power device.

In embodiments according to the present disclosure, the first vertical device isolation structure may extend through at least the group III-Nitride based device stack, and may extend further through any conductive parts of the substrate, stopping in an isolating part, e.g. a buried oxide in the case of SOI or in an isolating substrate. As a result, the vertical power device allows for easy isolation of parts of the first and second vertical III-Nitride based devices. The vertical power device may allow for efficient integration of two or more devices on the vertical power device, allowing for either parallel or serial connection of power devices of the same type (transistors) or different types (transistors and diodes).

In embodiments according to the present disclosure, the first vertical device isolation structure may be formed at least partially through the substrate. In this way, the bottom contacts of the first and second vertical group III-Nitride based devices can be isolated by means of the first vertical device isolation structure, possibly in combination with other means of isolation, such as isolating layers which may be comprised in the substrate. Therefore, the first vertical device isolation structure may provide reliable isolation of at least the bottom contacts, such as those of the first and second vertical group III-Nitride devices.

In embodiments according to the present disclosure, the electrical connection of the first and second vertical group III-Nitride based devices may comprise a first vertical deep via which extends from the top side up to at least the lower layer of the group III-Nitride based GaN device stack, and a first via isolation region which isolates the first vertical deep via from the first top contact, the upper layer, and the body layer, the first via isolation region being provided at least around the first vertical deep via in at least the upper layer and the body layer.

In embodiments according to the present disclosure, the electrical connection of the first vertical group III-Nitride based device and the second vertical group III-Nitride based device may further comprise a lateral interconnect which is formed at the top side over the first vertical device isolation structure, wherein the first vertical deep via electrically connects the lateral interconnect and at least the lower layer, and wherein the first isolation region further isolates the lateral interconnect.

As a result of this electrical connection through the structure, the vertical power device requires less packaging material and/or bondwires. Consequently, the electrical connection may reduce interconnection parasitics and switching transients which can improve the reliability of the vertical group III-Nitride based power devices and the efficiency of the vertical power device.

Furthermore, since the vertical power device allows for the expansion of monolithic integration from lateral planar devices to vertical devices, particularly, vertical group III-Nitride based devices, the vertical power device may achieve a more compact form factor and reduced overall price.

In embodiments according to the present disclosure, the first vertical deep via may extend from the lateral interconnect down to the first bottom contact of the first vertical group III-Nitride based device, such that the first and second vertical group III-Nitride based devices are connected in series. Such a series electrical connection allows for efficiently integrating vertical group III-Nitride based devices by electrically connecting the bottom side reference to the top side.

In embodiments according to the present disclosure, the first vertical deep via may be formed adjacent to the first vertical device isolation structure. As a result, the vertical power device can be processed using less material, and, therefore, achieve a more compact form factor.

In embodiments according to the present disclosure, at least one of the first and second top contact may be formed on the upper layer, wherein a body contact is connected to the at least one of the first and second top contact, the body contact being formed on the body layer. As a result, a more reliable connection can be formed on the body layer, which may improve the efficiency of the vertical power device. Therefore, the vertical power device may efficiently be able to handle high current and withstand high voltage.

In embodiments according to the present disclosure, the first and second vertical group III-Nitride based devices may be connected in parallel. The configuration of the top contacts and the bottom contacts on opposite sides of the vertical power device allows for efficient parallel connection of vertical group III-Nitride based devices. As a result, fewer interconnects may be used, leading to a more compact form factor and reduced overall price.

Another aspect of the present disclosure provides a vertical power system, as defined in the claims, integrating at least one of the vertical power devices described herein.

Another aspect of the present disclosure provides a method, as defined in the claims, for manufacturing a vertical power device as described herein.

BRIEF DESCRIPTION OF THE DRAWINGS

The present disclosure will be discussed in more detail below, with reference to the attached drawings.

FIG. 2B depicts a top view of an example vertical power device.

FIG. 15B depicts a top view of an example vertical power device.

DETAILED DESCRIPTION

Figure 1A:
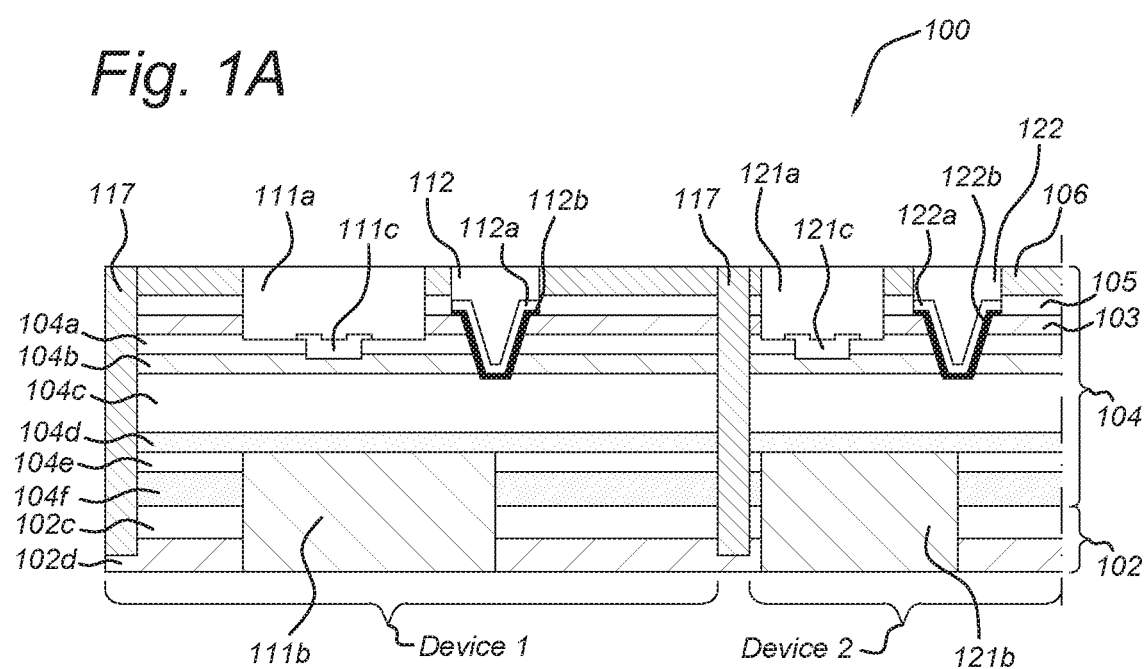
FIG. 1A depicts a cross-sectional view of an example vertical power device.

The following descriptions are of example embodiments and are not considered limiting in scope. Any reference herein to the disclosure is not intended to restrict or limit the disclosure to exact features of any one or more of the example embodiments disclosed in the present specification.

Furthermore, the terms first, second, third, and the like in the description and in the claims are used for distinguishing between similar elements and not necessarily for describing a sequential or chronological order. The terms are interchangeable under appropriate circumstances and the embodiments of the present disclosure can operate in other sequences than described or illustrated herein.

Moreover, the terms top, bottom, over, under, and the like in the description and the claims are used for descriptive purposes and not necessarily for describing relative positions. The terms so used are interchangeable under appropriate circumstances and the embodiments described herein can operate in other orientations than described or illustrated herein.

The term "comprising," as used in the claims, should not be interpreted as being restricted to the elements or steps listed thereafter; it does not exclude other elements or steps. It is to be interpreted as specifying the presence of the stated features, integers, steps, or components as referred to, but does not preclude the presence or addition of one or more other features, integers, steps, components, or groups thereof. Thus, the scope of the expression "a device comprising A and B" should not be limited to devices consisting only of components A and B. Rather, with respect to the recited expression, the only enumerated components of the device are A and B, and further the claim should be interpreted as including equivalents of those components.

A first embodiment of a vertical power device 100 according to the disclosure will be described with reference to FIGS. 1A and 1B. The vertical power device 100 has a top side 101a and a bottom side 101b and comprises a substrate 102 atop which a layered group III-Nitride based device stack 104 is formed.

In embodiments according to the present disclosure, e.g. the embodiment shown in FIG. 1A, the group III-Nitride based device stack 104 comprises layers having a group III species and nitrogen. The group III species may include one or more elements in group III of the Periodic Table, including B, Al, Ga, In, or Tl. The III-Nitride layer can be a compound that includes multiple Group III elements. The group III-Nitride based device stack 104 may include layers comprising binary compounds such as AlN, InN, or GaN, ternary compounds such as $Al_xGa_{1-x}N$ ($0 \leq x \leq 1$) or $In_xGa_{1-x}N$ ($0 \leq x \leq 1$) quaternary compounds such as $In_xAl_yGa_{1-x-y}N$ ($0 \leq x,y \leq 1$) or quinary compounds such as $Ga_xIn_{(1-x)}As_ySb_zN_{(1-y-z)}$ ($0 \leq x,y,z \leq 1$). Throughout this disclosure, we refer to the III-Nitride based device as a III-N device.

In embodiments according to the present disclosure, the III-N device stack 104 comprises a plurality of semiconductor layers having a body layer 104b of a first conduction type between a lower layer 104c and an upper layer 104a of a second conduction type. The conduction types may be an n-type or a p-type and may be achieved using methods known in the art, such as doping. For example, the body layer 104b may be n-type, and the lower layer 104c and the upper layer 4a may be p-type. In another example, the body layer 104b may be p-type, and the lower layer 104c and the upper layer 104a may be n-type. Furthermore, the layers 104a, 104b, 104c may each comprise one or more layers. As shown in FIG. 1A, the lower layer may comprise two lower layers 104c and 104d. Furthermore, each of the lower layers 104c, 104d may comprise one or more layers (not shown). The layers of the III-N device stack 104 may be undoped, unintentionally doped, or doped with donor or acceptor dopants. Methods for doping the layers of the III-N device stack are known in the art. The lower layer 104d can, for example, be a highly doped layer to form, for example, a low resistive contact. The doping concentration of the dopant in the lower layer 104d may be in the range of 1E18-5E19 $cm^{-3}$. In some examples, the lower layer 104c will be lowly doped, so that a high off-state potential can be sustained over the layer. The doping concentration of the dopant in the lower layer 104c may be in the range of 1E15-1E17 $cm^{-3}$. In some examples, the body layer 104b will be lowly doped, but with a doping concentration higher than that in the lower layer 104c, so that the depletion layer does not extend too far into this layer. The doping concentration of the dopant in the body layer 104b may be in the range of 5E16-5E18 $cm^{-3}$. In some examples, the upper layer 104a will be highly doped to form, for example, a low resistive contact. The doping concentration of the dopant in the upper layer 104a may be in the range of 1E18-5E19 $cm^{-3}$. Furthermore, the doping concentration of the dopant in the upper layer 104a and the lower layer 104d may be similar or different.

Furthermore, the plurality of semiconductor layers of the III-N device stack 104 may be epitaxially grown using methods known in the art, such as a process or processes based on molecular beam epitaxy, halide vapour phase epitaxy, physical vapour deposition, or chemical vapour deposition (CVD), such as metalorganic CVD (MOCVD). Other means of forming the layers of the III-N device stack 104 now known or later developed are contemplated herein as well. Furthermore, the III-N device stack 104 may further comprise one or more interlayers (not shown) interposed between the layers of the III-N device stack 104. The one or more interlayers may comprise solely, or a combination of, hydrogen silsesquioxane (HSQ), silicon nitride (SiN), aluminium nitride (AlN), aluminium indium nitride (AlInN), titanium nitride (TiN), tantalum nitride (TaN), or aluminium gallium nitride (AlGaN). In some examples, the one or more interlayers may be of the same composition as that of the layer atop of which the one or more interlayers are formed, and may, for example, be GaN based. Furthermore, the one or more interlayers may be intrinsic (i.e., pure or undoped).

In embodiments according to the present disclosure, e.g. the embodiment shown in FIG. 1A, the plurality of semiconductor layers may further have a nucleation layer 104e on top of which the lower layers 104c and 104d may be formed, for instance on top of which the lower layer 104d may be formed. The plurality of semiconductor layers may further comprise the nucleation layer 104e and a buffer layer 104f. The nucleation layer 104e may be formed on top of the substrate 102. The nucleation layer 104e is provided for growing the III-N device stack 104 on the substrate 102. The nucleation layer 104e may comprise one or more III-N compounds, which may be similar to the compounds comprised in the GaN device stack 104. The nucleation layer 104e may further comprise deep-level dopants, such as III-N compounds. The nucleation layer 104e may further comprise ionized contaminants. A concentration of the deep-level dopants may be at least as high as a concentration of the ionized contaminants. Thus, the nucleation layer 104e may be inducting or insulating. The plurality of semiconductor layers may further comprise a buffer layer 104f formed atop the nucleation layer 104e. The buffer layer 104f may be provided for, but not limited to, reducing defects and compensating stress in the vertical III-N device stack 104 due to lattice mismatch. Compounds comprised in the buffer layer 104f are known in the art, such as high-temperature or low-temperature compounds, such as a combination of III-Nitride materials. The buffer layer 104f may also comprise one or more superlattices, or multiple layer structures with alternating layers of III-Nitride materials, e.g. for stress compensation. The resistivity and/or conductivity of the nucleation layer 104e and/or the buffer layer 104f can be modified by using dopants.

In embodiments according to the present disclosure, e.g. the embodiment shown in FIG. 1A, the substrate 102 may comprise a carrier layer 102c. The carrier layer 102c may be an inducting carrier layer or an insulating carrier layer. Examples of an inducting carrier layer may be Si, SiC, or other inducting material known in the art. Examples of an insulating carrier layer may be highly resistive bulk GaN, poly-AlN, or any other way known in the art for insulating the carrier layer 102c. The substrate 102 may further comprise a handling layer 102d atop of which the carrier layer 102c is formed. The handling layer 102d may be provided for handling the vertical power device 100.

In embodiments according to the present disclosure, e.g. the embodiment shown in FIG. 1A, the layered III-N device stack 104 may further comprise one or more passivation layers. In particular, the layered III-N device stack 104 may comprise a first passivation layer 103 formed atop the upper layer 104a. The first passivation layer 103 may be provided for protecting the III-N device stack 104 from environmental influences, such as electrical and chemical contaminants. The first passivation layer 103 may be provided for protecting at least the top side 101a of the vertical power device 100. Compounds comprised in the first passivation layer 103 are known in the art, such as aluminium oxide ($Al_2O_3$), titanium dioxide ($TiO_2$), hafnium dioxide ($HfO_2$), silicon oxide ($SiO_2$), silicon nitride ($Si_3N_4$), silicon nitride/amorphous silicon ($SiN_x$/a-Si), silicon nitride/silicon rich silicon nitride ($SiN_x$/Si-rich-$SiN_x$), and/or polyamides.

In embodiments according to the present disclosure, e.g. the embodiment shown in FIG. 1A, the vertical power device 100 comprises a first vertical III-N device "Device 1" and a second vertical III-N device "Device 2" formed in the III-N device stack 104. The first vertical III-N device comprises a first top contact 111*a* and a first bottom contact 111*b*, and the second vertical III-N device comprises a second top contact 121*a* and a second bottom contact 121*b*. The first and second top contacts 111*a*, 121*a* are formed at the top side 101*a* of the vertical power device 100, and the first and second bottom contacts 111*b*, 121*b* are formed at the bottom side 101*b* of the vertical power device 100. The first and second top contacts 111*a*, 121*a* may be formed by forming one or more front metallization layers. The first and second bottom contacts 111*b*, 121*b* may be formed by forming one or more back metallization layers.

In embodiments according to the present disclosure, e.g. the embodiment shown in FIG. 1A, the first top contact 111*a* and the second top contact 121*a* may extend into the III-N device stack 104. Each of the first and second top contacts 111*a*, 121*a* may extend in one or more of the upper layer 104*a*, the body layer 104*b*, or the lower layer 104*c*, 104*d*. In some examples, at least one of the first and second top contacts 111*a*, 121*a* is formed on the upper layer 104*a*. Furthermore, a first and second body contact 111*c*, 121*c* may be connected to the at least one of the first and second top contacts 111*a*, 121*a*. In some examples, at least one of the body contacts 111*c*, 121*c* is formed in the body layer 104*b*, and the corresponding top contact 111*a*, 121*a* is formed in the upper layer 104*a*.

In embodiments according to the present disclosure, e.g. the embodiment shown in FIG. 1A, the first bottom contact 111*b* and the second bottom contact 121*b* may be formed in the substrate 102 in the buffer layer 104*f* and the nucleation layer 104*e*, such that the bottom contacts 111*b*, 121*b* form an ohmic contact with the layered III-N device stack 104, such as with the lower layer 104*d*. The first bottom contact 111*b* and the second bottom contact 121*b* may be further formed in the lower layer 104*d* forming an ohmic contact with the lower layer 104*d*. As shown in FIG. 1A, the first and second bottom contacts 111*b*, 121*b* may be formed in the substrate 102 and in contact with the lower layer 104*d* of the III-N device stack 104. The first and second bottom contacts 111*b*, 121*b* may be formed by one or more metal conductors, which may be isolated from each other, or which may be electrically connected to each other via a conductive layer of the substrate, such as for example the handling layer 102*d* or the carrier layer 102*c*. In alternative embodiments, the first and second bottom contacts 111*b*, 121*b* may be formed as a single bottom contact in the substrate 102.

Figure 1B:
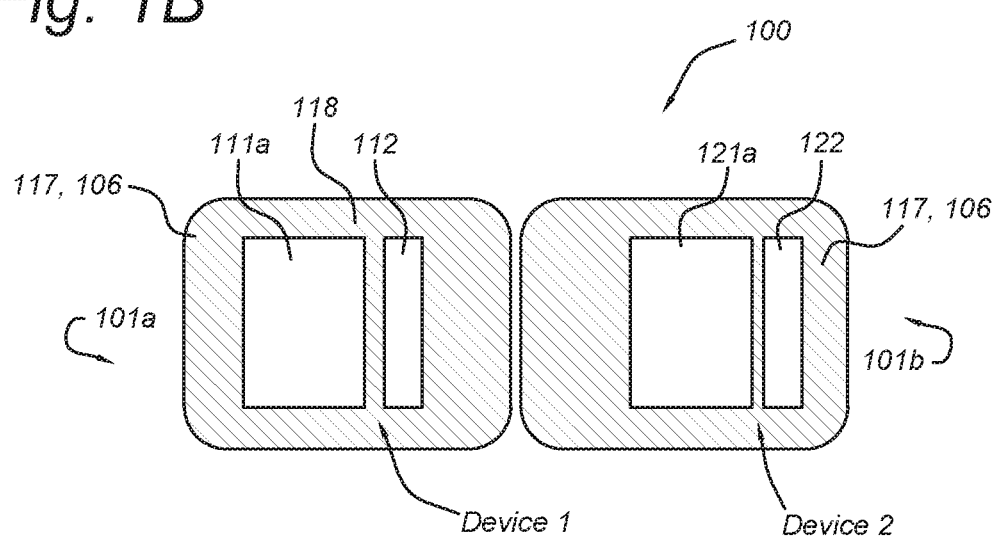
FIG. 1B depicts a top view of an example vertical power device.

In embodiments according to the present disclosure, e.g. the embodiment shown in FIGS. 1A and 1B, at least one of the first and second vertical III-N devices may further comprise a first and/or second gate 112, 122. In FIG. 1A, the gate(s) 112, 122 may comprise a gate electrode 112*a*, 122*a* and a gate dielectric 112*b*, 122*b*. The gate(s) 112, 122 may be formed on the lower layer 104*c*, particularly the gate dielectric 112*b*, 122*b* may be formed on the lower layer 104*c*. The gate dielectric 112*b*, 122*b* is provided for electrically insulating the gate electrode 112*a*, 122*a* from the vertical III-N device stack 104. Other means of producing a discontinuity between the vertical III-N device stack 104 and the gate electrode 112*a*, 122*a* can be for using a Schottky contact, for example, or by having a gate electrode 112*a*, 122*a* formed on the body layer 104*b*. A second passivation layer 105 may be formed atop the first passivation layer 103 which is formed atop the III-N device stack 104. Furthermore, a third passivation layer 106 may be formed atop the second passivation layer 105. The second and third passivation layers 105, 106 may be similar to or different from the first passivation layer 103.

In what follows, example ranges for thickness of each of layers in the vertical power device 100 will be provided. For the passivating dielectric layers 103, 105, 106, the range can be in the order of 10 nm to 5 μm, such as in the order of 10 nm to 2 μm. For the upper layer 104*a*, the range can be in the order of 100-500 nm. For the body layer 104*b*, the range can be in the order of 200 nm to 1 μm. For the lower layer 104*c*, the range can be in the order of 0.5-100 μm, the thickness and doping level of this layer will determine the breakdown of the component, e.g. assuming optimal doping level for a GaN drift, a thickness of 1 μm gives a theoretical maximum breakdown of ~300V, for a thickness of 3 μm the breakdown voltage is ~1 kV, and for 10 μm it is around 2.5 kV. For the lower layer 104*d*, the range can be in the order of 1-10 μm. For the nucleation layer 104*e*, the range can be in the order of 100-500 nm. For the buffer layer 104*f*, the range can be in the order of 100 nm-2 μm. For the carrier layer 102*c*, the range can be in the order of 100-2 μm. For the handling layer 102*d*, the range can be in the order of 0.725-1.1 μm.

In embodiments according to the present disclosure, e.g. the embodiment shown in FIG. 1A, the vertical power device 100 further comprises at least a first vertical device isolation structure 117 that isolates the first vertical III-N device from the second vertical III-N device. The first vertical device isolation structure 117 may be formed as a trench isolation module by recessing through at least the upper layer 104*a*, the body layer 104*b*, and the lower layer 104*c*, extending to the lower layer 104*d*. The first vertical isolation structure 117 may further extend through the first passivation layer 103, may further extend through the second passivation layer 105, and may further extend through the third passivation layer 106. In some examples, the first vertical device isolation structure 117 may be formed as a deep trench isolation module by recessing further through at least the III-N device stack 104 such that direct connections through the layers of the layered III-N device stack 104 are interrupted. The first vertical device isolation structure 117 may further extend through at least part of the substrate 102 stopping in an isolating part of the substrate. As shown in FIG. 1A, the first vertical device isolation structure 117 may further extend into the substrate 102, such as through any conductive parts of the substrate, e.g. the carrier layer 102*c* which can be conductive, and stopping in an isolating part of the substrate, e.g. the handling layer 102*d* which can be insulating. The first vertical device isolation structure 117 may further extend through the handling layer 102*d*, such as if the handling layer 102*d* does not have isolating properties. Alternatively, if the handling layer 102*d* does not have isolating properties (i.e., is conductive), and if the first vertical device isolation structure 117 extends through parts of the substrate stopping in the handling layer 102*d*, then the bottom contacts 111*b*, 121*b* may be isolated from each other by other means known in the art, e.g. by depositing a dielectric in between the bottom contacts 111*b*, 121*b* and the handling layer 102*d*. The dielectric may be further deposited in between the bottom contacts 111*b*, 121*b* and other parts of the substrate 102 thereby allowing the bottom contacts 111*b*, 121*b* to be electrically connected to the relevant layer(s) and isolated from each other.

The first vertical device isolation structure 117 is formed at least between the first and second vertical III-N devices to isolate at least their top and gate contacts from each other.

The first vertical device isolation structure 117 may be further formed surrounding the first vertical III-N device and the second vertical III-N device, to isolate them from further devices. In embodiments, the first vertical device isolation structure 117 may isolate portions of one or more conductive layers of the substrate 102 and thus isolate the first bottom contact 111b and the second bottom contact 121b from each other and/or further bottom contacts of further devices.

In embodiments according to the present disclosure, e.g. the embodiment shown in FIG. 1A, the first and second vertical III-N devices, or parts thereof, may be electrically connected through any layer or layers in the vertical III-N device stack 104 and/or substrate 102. Thus, the first vertical device isolation structure 117 may be provided for selectively connecting and/or insulating any layer or layers in the vertical III-N device stack 104 and/or substrate 102. Other means of electrically connecting the first and second vertical III-N devices will be described in further detail below.

A second embodiment of a vertical power device 200 according to the disclosure will be described with reference to FIGS. 2A and 2B. The vertical power device 200 corresponds in many aspects and/or features to the vertical power device 100 of the first embodiment of FIGS. 1A and 1B. Therefore, only the differences will be described in detail for the sake of brevity.

Figure 2A:
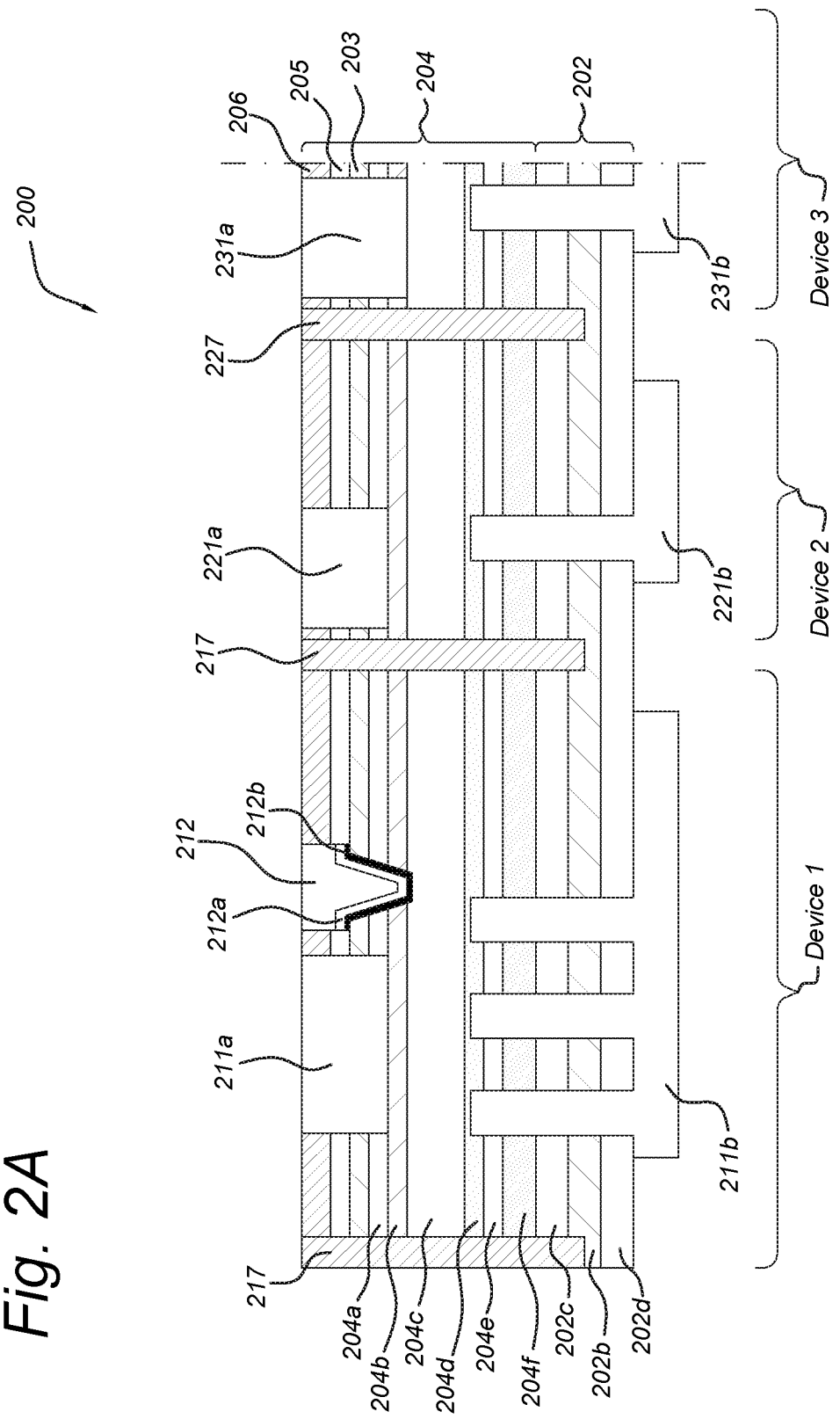
FIG. 2A depicts a cross-sectional view of an example vertical power device.

In embodiments according to the present disclosure, e.g. the embodiment shown in FIGS. 2A and 2B, the vertical power device 200 comprises a first vertical III-N device "Device 1," a second vertical III-N device "Device 2," and a third vertical III-N device "Device 3" formed in the III-N device stack 204, which may comprise layers 204a-204f which may be the same as layers 104a-104f described above, on top of substrate 202, which may comprise layers 202c-202d which may be the same as layers 102c-102d described above, and covered by one or more passivation layers 203, 205, 206, which may be the same as layers 103, 105, 106. The first vertical III-N device comprises a first top contact 211a and a first bottom contact 211b, the second vertical III-N device comprises a second top contact 221a and a second bottom contact 221b, and the third vertical III-N device comprises a third top contact 231a and a third bottom contact 231b. The first top and bottom contacts 211a, 211c and the second top and bottom contacts 221a, 221b may be formed using metallization layers in the same manner as has been described for the contacts 111a, 111b, 121a, 121b above. The first vertical III-N device comprises a gate 212, comprising a gate electrode 212a and a gate dielectric 212b, which may be formed in the same way as has been described for gates 112, 122 above.

The vertical power device 200 comprises a first vertical device isolation structure 217 that isolates the first vertical III-N device from the second vertical III-N device. The third vertical III-N device may be isolated from the first and second vertical III-N devices by a second vertical device isolation structure 227.

The third vertical III-N device may be formed in a similar manner as is described herein for the first or second III-N devices. The first, second, and third vertical III-N devices and their top, bottom, and/or gate contacts may be isolated or electrically connected in a manner similar to the isolation or electrical connections described elsewhere herein.

In embodiments according to the present disclosure, e.g. the embodiment shown in FIGS. 2A and 2B, the vertical power device 200 may comprise homogeneous and/or heterogeneous vertical III-N devices. In other words, the first, second, and third vertical III-N devices may be similar or different. In embodiments, each of the first, second, and third vertical III-N devices may be one of a thyristor, transistor, power (intrinsic) diode, or Schottky diode. FIG. 1A shows the vertical power device 100 which comprises two transistors. In FIG. 2A, the first, second, and third vertical III-N devices are respectively a transistor, a power diode (with the top contact 221a in contact with the body layer 204b and using pn-junction, resp. np-junction 204b-204c) and a Schottky diode (with the top contact 231a in contact with the lower layer 204c and forming a Schottky barrier therewith).

The substrate 202 may further comprise a buried oxide layer 202b formed between the carrier layer 202c and the handling layer 202d. For example, the buried oxide layer 202b can comprise $SiO_2$ when the substrate is a SOI. The thickness of the buried oxide layer 202b may be in the range of 0.5-2 μm, such as 0.5-1.5 μm. The carrier layer 202c may comprise one or more layers, e.g. a carrier layer and a buried oxide layer as for the case of SOI.

The second vertical device isolation structure 227 may be formed in a manner as has been described above for the first vertical device isolation structure 117, such that the first and second vertical device isolation structure 217, 227 may be formed in a similar or different manner in the same vertical power device 200. In FIG. 2A, the first and second vertical device isolation structures 217, 227 may extend through the III-N device stack 204 and at least part of the substrate 202. In FIG. 2B, the second vertical device isolation structure 227 may be formed around the second vertical III-N device and/or the third vertical III-N device, in a manner as has been described above for the first vertical device isolation structure 117. The first and second vertical device isolation structures 217, 227 may be formed in similar and/or different layers in the vertical power device 200. In the embodiment shown in FIG. 2A, the first and the second vertical device isolation structures 217, 227 are formed in all the layers of the vertical III-N device stack 204 and in the carrier layer 202c extending to the buried oxide layer 202b. In another example, the first vertical device isolation structure 217 may instead extend only in the layers of the vertical device stack 204 and not in the substrate 202. In this example, the first and second bottom contacts 211b, 221b may be electrically connected via the carrier layer 202c of the substrate, whereas the third bottom contact 231b may be isolated from the second bottom contact 221b.

A third embodiment of a vertical power device 300 according to the disclosure will be described with reference to FIGS. 3A and 3B. The vertical power device 300 corresponds in many aspects and/or features to the vertical power devices 100, 200 of the first and second embodiments of FIGS. 1A, 1B, 2A, and 2B. Therefore, only the differences will be described in detail for the sake of brevity.

Figure 3A:
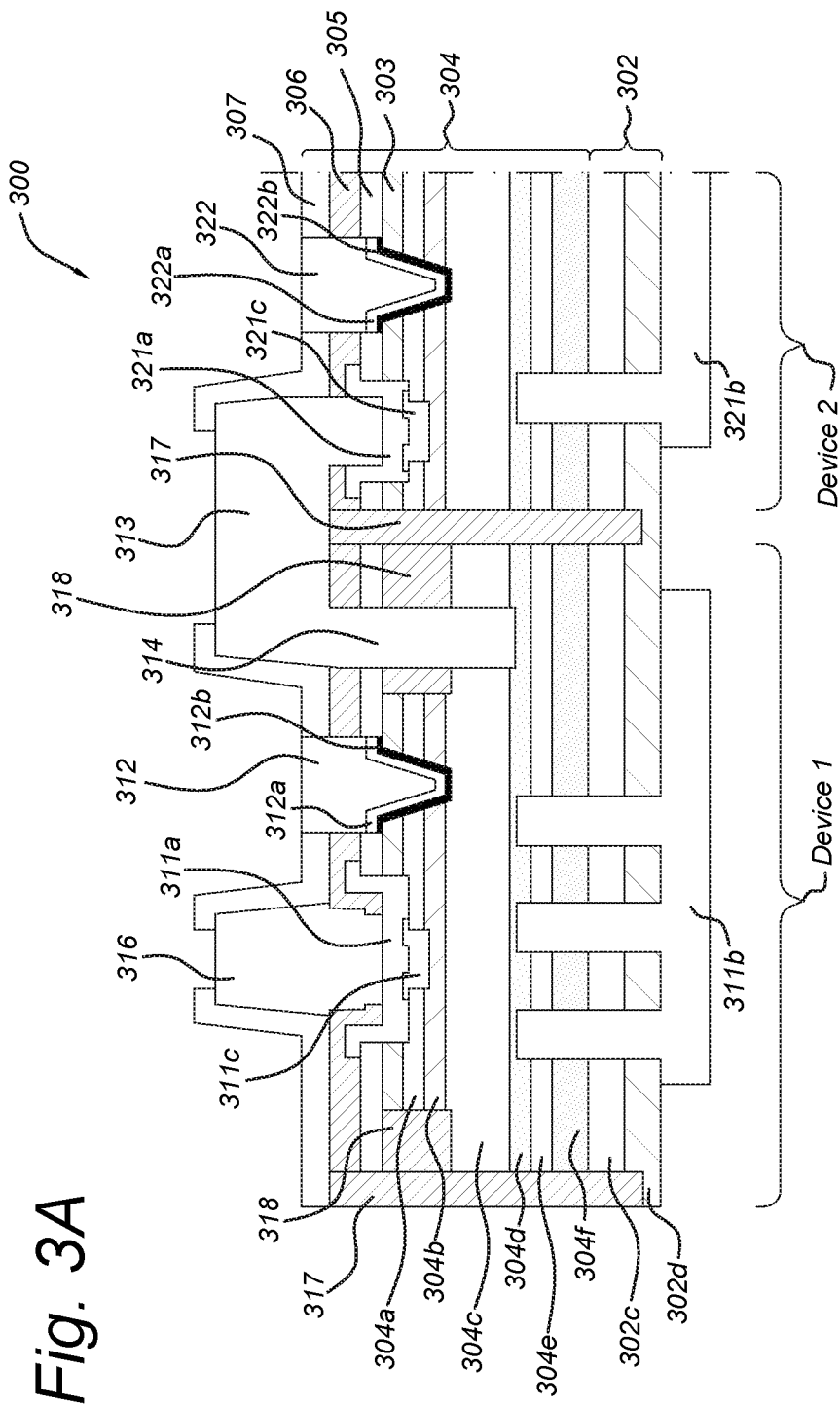
FIG. 3A depicts a cross-sectional view of an example vertical power device.
Figure 3B:
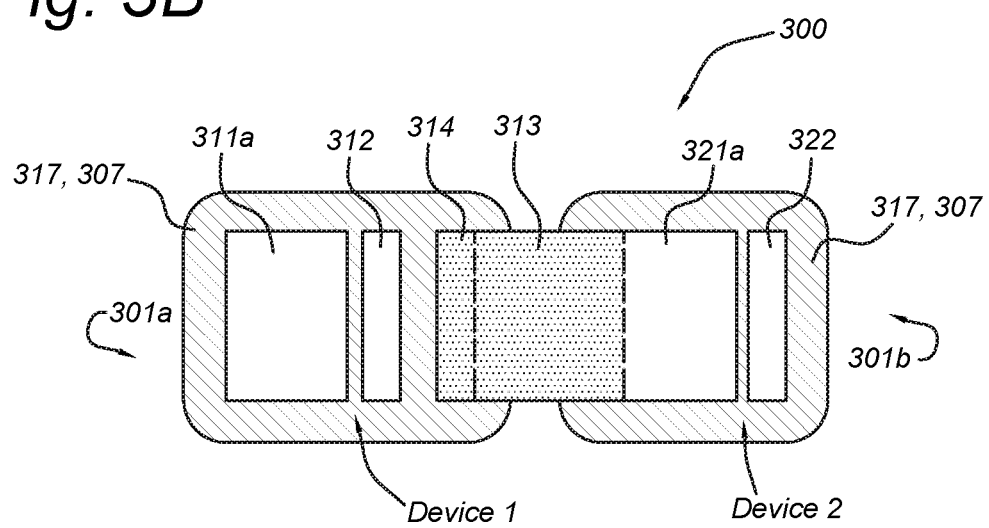
FIG. 3B depicts a top view of an example vertical power device.

In embodiments according to the present disclosure, e.g. the embodiment shown in FIGS. 3A and 3B, the vertical power device 300 comprises a first vertical III-N device "Device 1" and a second vertical III-N device "Device 2," formed in the III-N device stack 304, which may comprise layers 304a-304f which may be the same as layers 104a-104f described above, on top of substrate 302, which may comprise layers 302c-302d which may be the same as layers 102c-102d described above, and covered by one or more passivation layers 303, 305, 306, which may be the same as layers 103, 105, 106. Furthermore, the substrate 302 may further comprise a buried oxide layer (not shown) which may be the same as layer 202b. The first vertical III-N device comprises a first top contact 311a and a first bottom contact 311b, the second vertical III-N device comprises a second top contact 321a and a second bottom contact 321b. The first and second vertical III-N devices respectively comprise first and second gates 312, 322. The gates each comprise a gate electrode 312a, 322a and a gate dielectric 312b, 322b, which may be formed in the same way as has been described for gates 112, 122 above.

The vertical power device 300 comprises a first vertical device isolation structure 317 that isolates the first vertical III-N device from the second vertical III-N device. The vertical device isolation structure 317 may be formed in a manner as has been described above for the first vertical device isolation structure 117, 217.

In embodiments according to the present disclosure, e.g. the embodiment shown in FIGS. 3A and 3B, the vertical power device 300 may further comprise a first lateral interconnect 313 which may be formed at the top side 301a over the first vertical device isolation structure 317. The first lateral interconnect 313 may be formed on the third passivation layer 306 at the top side 301a of the vertical power device 300. The first lateral interconnect 313 may be formed on the first or second passivation layers 303, 305, wherein part of the second and/or third passivation layers 305, 306 may be recessed thereby allowing the first lateral interconnect 313 to be formed in the recessed part. The first lateral interconnect 313 extends at least partly over the second top contact 321a to make electrical contact therewith.

In embodiments according to the present disclosure, e.g. the embodiment shown in FIGS. 3A and 3B, the vertical power device 300 may further comprise a power metal 316, which may be formed on the first top contact 311a. The power metal 316 may extend through the second and third passivation layers 305, 306. Furthermore, a fourth passivation layer 307 may be formed on the third passivation layer 306 and partially over the power metal 316 and the first lateral interconnect 313. As shown in FIG. 3A, the power metal 316 forms an upwards extension of the first top contact 311a and the first lateral interconnect 313 forms an upwards extension of the second top contact 321a.

In embodiments according to the present disclosure, e.g. the embodiment shown in FIG. 3A, the vertical power device 300 may further comprise a first vertical deep via 314 which may be formed extending from the top side 301a up to at least the lower layer 304c, 304d of the III-N device stack 304, so as to electrically connect the first lateral interconnect 318 (and hence the top contact 321a of the second device) to the respective lower layer 304c, 304d. The vertical power device 300 may further comprise a first via isolation region 318 which may be formed in the upper layer 304a and body layer 304b. The first via isolation region 318 may further extend through at least one of the passivation layers 303, 305, 306. The first via isolation region 318 is provided for isolating the first lateral interconnect 313 and the first vertical deep via 314 from the conductive layers of the III-N stack and hence the first top contact 311a and the gate 312. As shown, the first via isolation region 318 may be formed around the first vertical deep via 314 in at least the upper layer 304a and the body layer 304b. Furthermore, the first lateral interconnect 313 may extend from over the second top contact 321a to an area over the first via isolation region 318 in between the first and second top contacts 311a, 321a. As shown in FIG. 3A, the first vertical deep via 314 and/or the first via isolation region 318 may be formed adjacent to the first vertical device isolation structure 317 in between the first and second top contacts 311a, 321a. The first vertical deep via 314 forms an electrical connection between the first lateral interconnect 313 and the lower layer 304c, 304d. Thus, the second top contact 321a may be electrically connected to at least the lower layer 304c, 304d of the III-N device stack 304. Such a connection may be used to determine a voltage reference from the first vertical III-N device.

A fourth embodiment of a vertical power device 400 according to the disclosure will be described with reference to FIGS. 4A and 4B. The vertical power device 400 corresponds in many aspects and/or features to the vertical power devices 100, 200, 300 of the first, second, and third embodiments of FIGS. 1A, 1B, 2A, 2B, 3A and 3B. Therefore, only the differences will be described in detail for the sake of brevity.

Figure 4B:
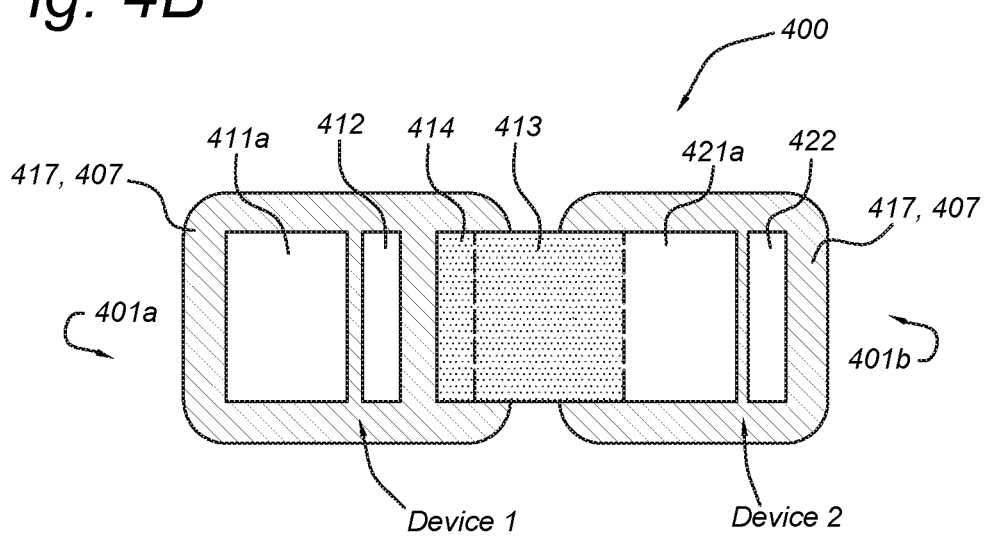
FIG. 4B depicts a top view of an example vertical power device.
Figure 4A:
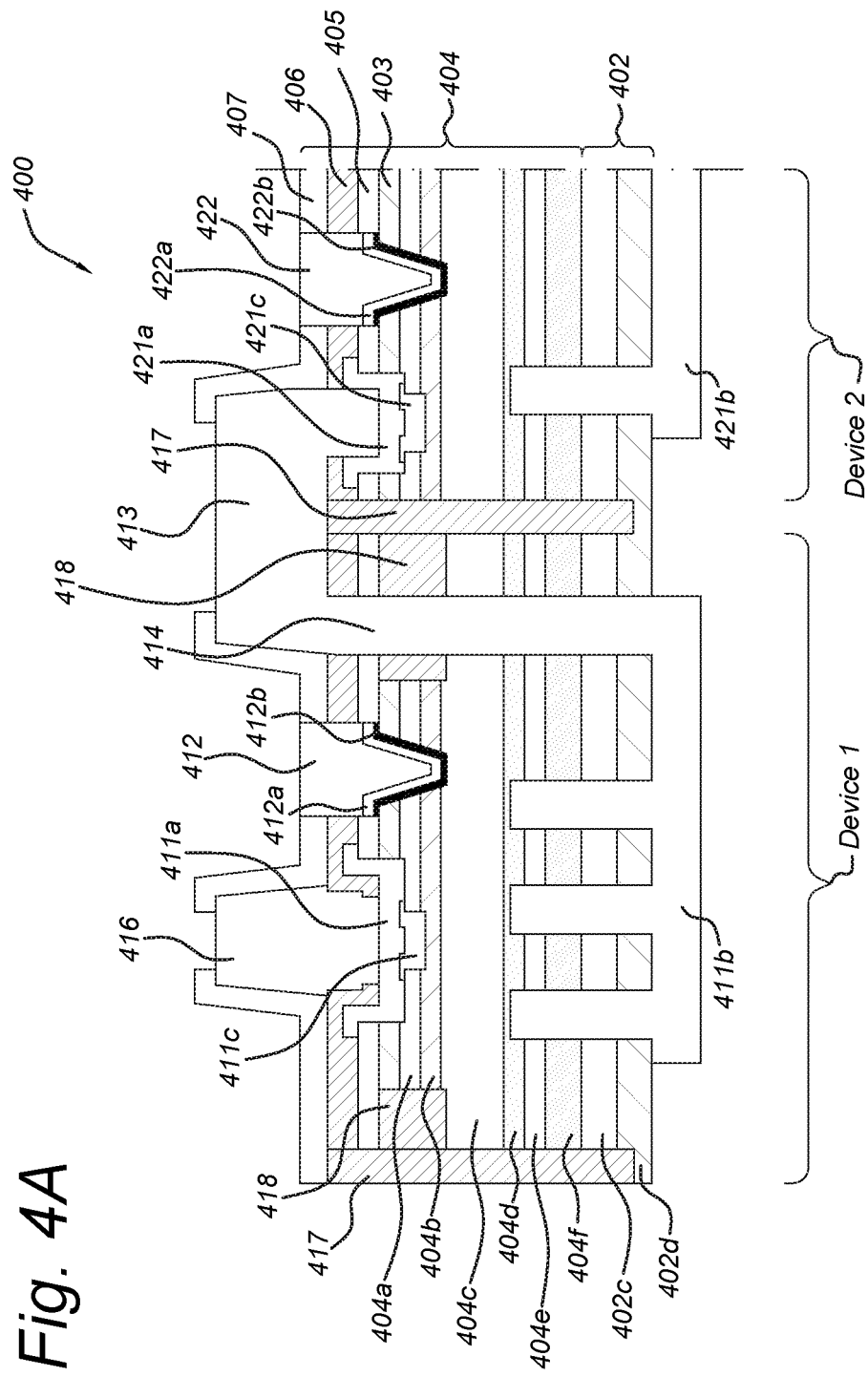
FIG. 4A depicts a cross-sectional view of an example vertical power device.

In embodiments according to the present disclosure, e.g. the embodiment shown in FIGS. 4A and 4B, the vertical power device 400 comprises a first vertical III-N device "Device 1" and a second vertical III-N device "Device 2," formed in the III-N device stack 404, which may comprise layers 404a-404d which may be the same as layers 104a-104d described above, on top of substrate 402, which may comprise layers 402c-402d which may be the same as layers 102c-102d described above, and covered by one or more passivation layers 403, 405, 406, 407 which may be the same as layers 303, 305, 306, 307. Furthermore, the substrate 402 may further comprise a buried oxide layer (not shown) which may be the same as layer 202b. The first vertical III-N device comprises a first top contact 411a and a first bottom contact 411b, and the second vertical III-N device comprises a second top contact 421a and a second bottom contact 421b. The first and second vertical III-N devices respectively comprise first and second gates 412, 422. The gates each comprise a gate electrode 412a, 422a and a gate dielectric 412b, 422b, which may be formed in the same way as has been described for gates 112, 122 above.

In the same way as in the embodiment of FIGS. 3A-B, the vertical power device 400 comprises a first vertical device isolation structure 417 that isolates the first vertical III-N device from the second vertical III-N device. The vertical device isolation structure 417 may be formed in a manner as has been described above for the first vertical device isolation structure 117, 217.

In the same way as in the embodiment of FIGS. 3A-B, the vertical power device 400 comprises a first lateral interconnect 413 over the first vertical device isolation structure 417. The first lateral interconnect 413 extends at least partly over the second top contact 421a to make electrical contact therewith. In the same way as in the embodiment of FIGS. 3A-B, the vertical power device 400 comprises a power metal 416, formed on the first top contact 411a.

Similar to the embodiment of FIGS. 3A-B, the vertical power device 400 comprises a first vertical deep via 414. In the embodiment of FIGS. 4A-B, the via 414 extends from the first lateral interconnect 413 at least up to a conductive layer of the substrate 402 and/or, as shown, up to the first bottom contact 411b. In this way, the first vertical deep via 414 forms an electrical connection between the first lateral interconnect 413 and the first bottom contact 411b. Consequently, the second top contact 421a may be electrically connected to the first bottom contact 411b. In this way, the first vertical III-N device and the second vertical III-N device may be electrically connected in a series connection (i.e. their drain-source paths are connected in series).

In the same way as in the embodiment of FIGS. 3A-B, the vertical power device 400 comprises a first via isolation region 418 formed in the upper layer 404a and body layer 404b, for isolating the first lateral interconnect 413 and the first vertical deep via 414 from the conductive layers of the III-N stack and hence the first top contact 411a and the gate 412.

In embodiments according to the present disclosure (not shown), e.g. based on the embodiment shown in FIGS. 1A-B, the first vertical III-N device and the second vertical III-N device may be connected in parallel. The parallel connection may comprise a top lateral connection of the top contacts 111a, 121a and a bottom lateral connection of the bottom contacts 111b, 121b. In order to facilitate the top lateral connection, the first III-N device may be provided in mirror image compared to what is shown in FIGS. 1A-B, i.e. with the first top contact 112a adjacent to the first vertical device isolation structure 117 in between the devices.

The above described embodiments for electrically connecting the first and second vertical III-N devices in series or parallel are in no way limiting to other means of connecting the first and second vertical III-N devices. The means described in this disclosure and other means known in the art may be used to electrically connect the first and second vertical III-N devices, such as, but not limited to, electrically connecting the second top contact to the first gate, the second gate to the first gate, the second gate to the first bottom contact, etc.

Figure 5A:
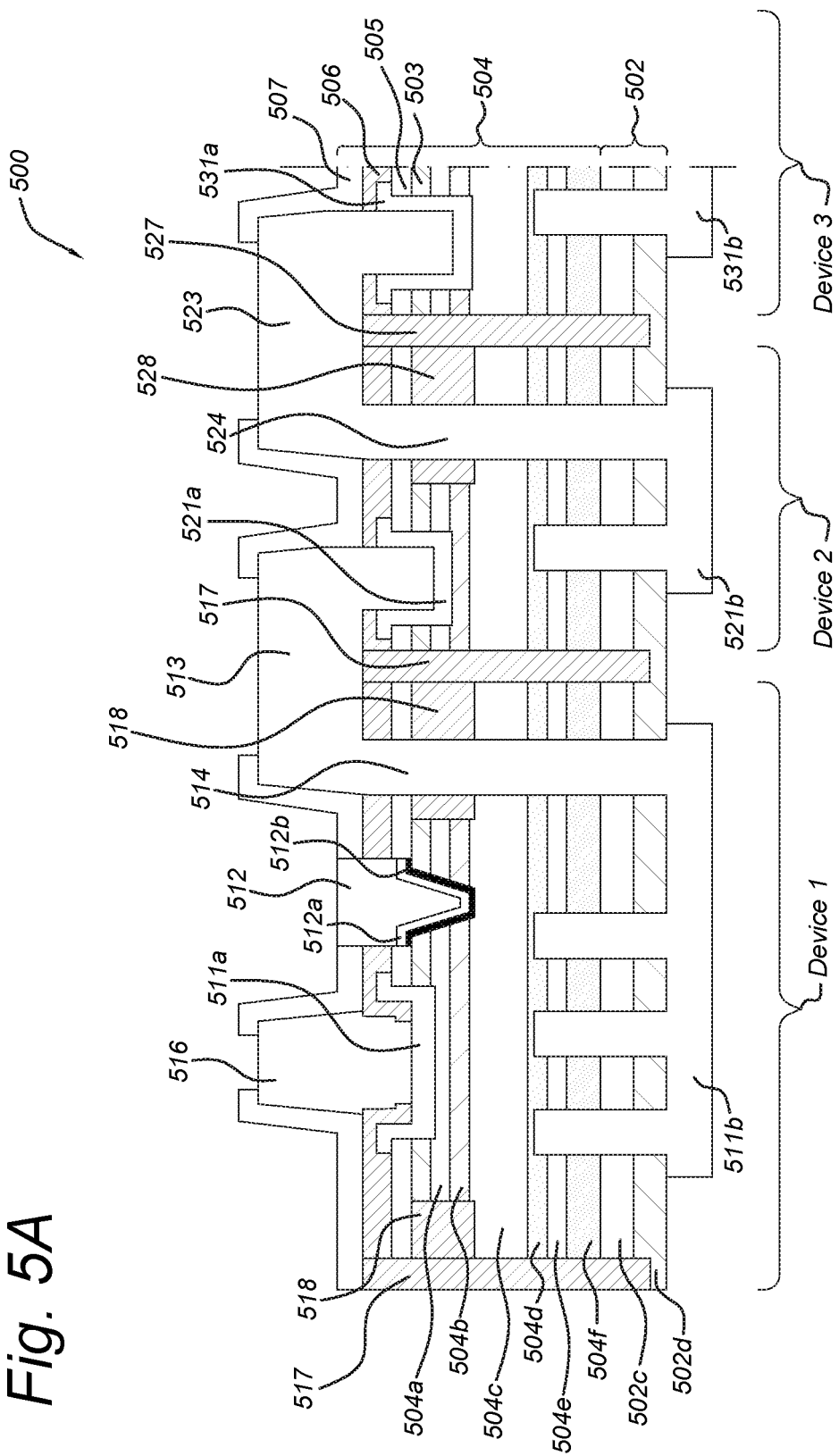
FIG. 5A depicts a cross-sectional view of an example vertical power device.
Figure 5B:
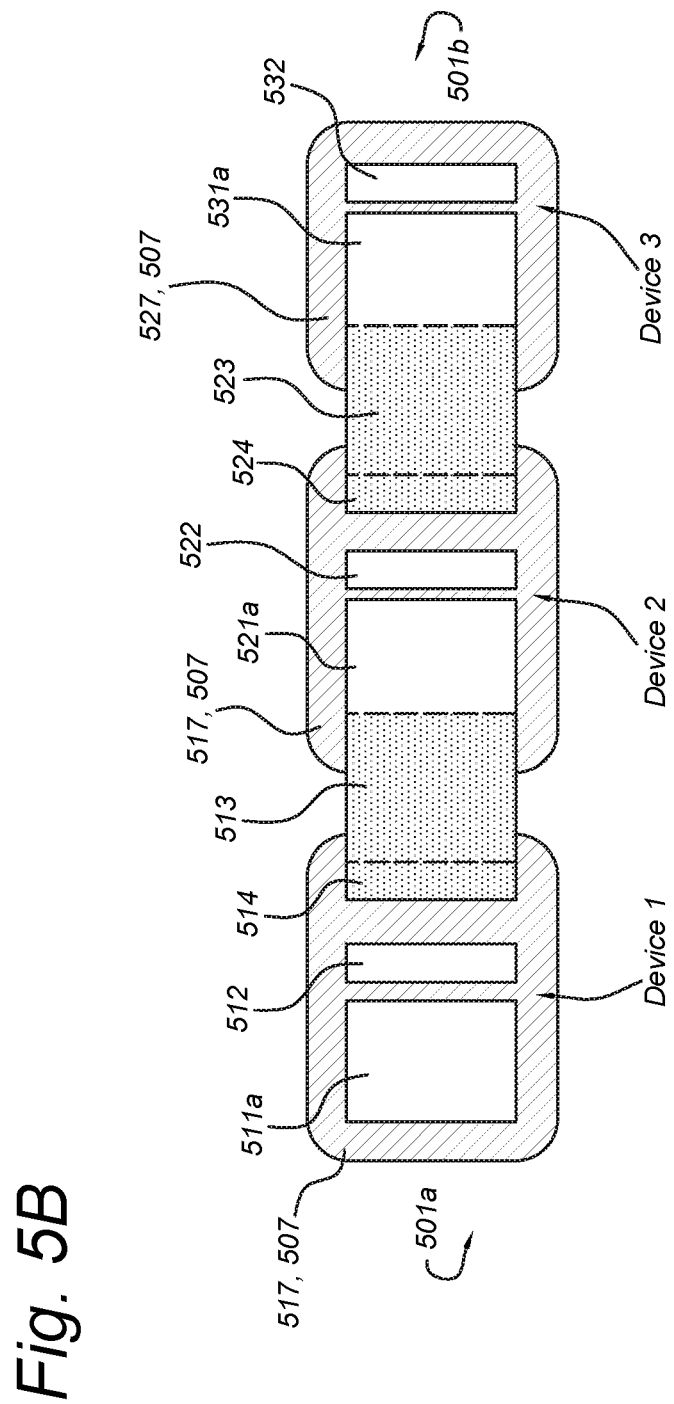
FIG. 5B depicts a top view of an example vertical power device.

A fifth embodiment of a vertical power device 500 according to the disclosure will be described with reference to FIGS. 5A and 5B. The vertical power device 500 corresponds in many aspects and/or features to the vertical power devices 100, 200, 300, 400 of the first, second, third, and fourth embodiments of FIGS. 1A, 1B, 2A, 2B, 3A, 3B, 4A, and 4B. Therefore, only the differences will be described in detail for the sake of brevity.

In the same way as in FIGS. 2A-B, the vertical power device 500 comprises a first vertical III-N device "Device 1," a second vertical III-N device "Device 2," and a third vertical III-N device "Device 3" formed in the III-N device stack 504, which may comprise layers 504a-504f which may be the same as layers 104a-104f described above, on top of substrate 502, which may comprise layers 502c-502d which may be the same as layers 202c-202d described above, and covered by one or more passivation layers 503, 505, 506, 507 which may be the same as layers 303, 305, 306, 307. The first vertical III-N device comprises a first top contact 511a and a first bottom contact 511b, the second vertical III-N device comprises a second top contact 521a and a second bottom contact 521b, and the third vertical III-N device comprises a third top contact 531a and a third bottom contact 531b. The first vertical III-N device comprises a gate 512, comprising a gate electrode 512a and a gate dielectric 512b, which may be formed in the same way as has been described for gates 112, 122 above. The first, second, and third vertical III-N devices are respectively a transistor, a power diode (with the top contact 521a in contact with the body layer 504b and using pn-junction, resp. np-junction 504b-504c), and a Schottky diode (with the top contact 531a in contact with the lower layer 504c and forming a Schottky barrier therewith).

In the same way as in FIGS. 2A-B, the vertical power device 500 comprises a first vertical device isolation structure 517 that isolates the first vertical III-N device from the second vertical III-N device. The third vertical III-N device is isolated from the first and second vertical III-N devices by a second vertical device isolation structure 527.

Similar to FIGS. 4A-B, the devices are connected in series, i.e. the first bottom contact 511b is connected to the second top contact 521a, and the second bottom contact 522b is connected to the third top contact 531a. The series connection is provided by first, resp. second lateral interconnects 513, 523 and first, resp. second vertical deep via 514, 524, the latter being isolated from the conductive layers of the III-N stack by means of first, resp. second via isolation regions 518, 528.

In embodiments according to the present disclosure, at least one of the first, second, and third vertical III-N devices may further comprise a first, second, and/or third gate. For example, if the first, second, and third vertical III-N devices are transistors, then these transistors may comprise a first, second, and third gate.

The above described embodiments for electrically connecting at least two of the first, second, and third vertical III-N devices in series or parallel are in no way limiting to other means of connecting the first and second vertical III-N devices. The means described in this disclosure and other means known in the art may be used to electrically connect at least two of the first, second, and third vertical III-N devices, such as, but not limited to, electrically connecting the third top contact to the second gate, the third gate to the second gate, the third gate to the second bottom contact, etc.

A sixth embodiment of a vertical power device 600 according to the disclosure will be described with reference to FIGS. 15A and 15B. The vertical power device 600 corresponds in many aspects and/or features to the vertical power devices 100, 200, 300, 400, 500 of the first, second, third, fourth, and fifth embodiments of FIGS. 1A, 1B, 2A, 2B, 3A, 3B, 4A, 4B, 5A, and 5B. Therefore, only the differences will be described in detail for the sake of brevity.

In the same way as in FIGS. 2A-B, the vertical power device 600 comprises a first vertical III-N device "Device 1," a second vertical III-N device "Device 2," and a third vertical III-N device "Device 3" formed in the III-N device stack 604, which may comprise layers 604a-604f which may be the same as layers 104a-104f described above, on top of substrate 602, which may comprise layers 602b-602d which may be the same as layers 202b-202d described above, and covered by one or more passivation layers 603, 605, 606 which may be the same as layers 103, 105, 106. The first vertical III-N device comprises a first top contact 611a and a first bottom contact 611b, the second vertical III-N device comprises a second top contact 621a and a second bottom contact 621b, and the third vertical III-N device comprises a third top contact 631a and a third bottom contact 631b. The first vertical III-N device comprises a gate 612, comprising a gate electrode 612a and a gate dielectric 612b, which may be formed in the same way as has been described for gates 112, 122 above. The first, second, and third vertical III-N devices are respectively a transistor, a power diode (with the top contact 621a in contact with the body layer 604b and using pn-junction, resp. np-junction 604b-604c), and a Schottky diode (with the top contact 631a in contact with the lower layer 604c and forming a Schottky barrier therewith).

Figure 15A:
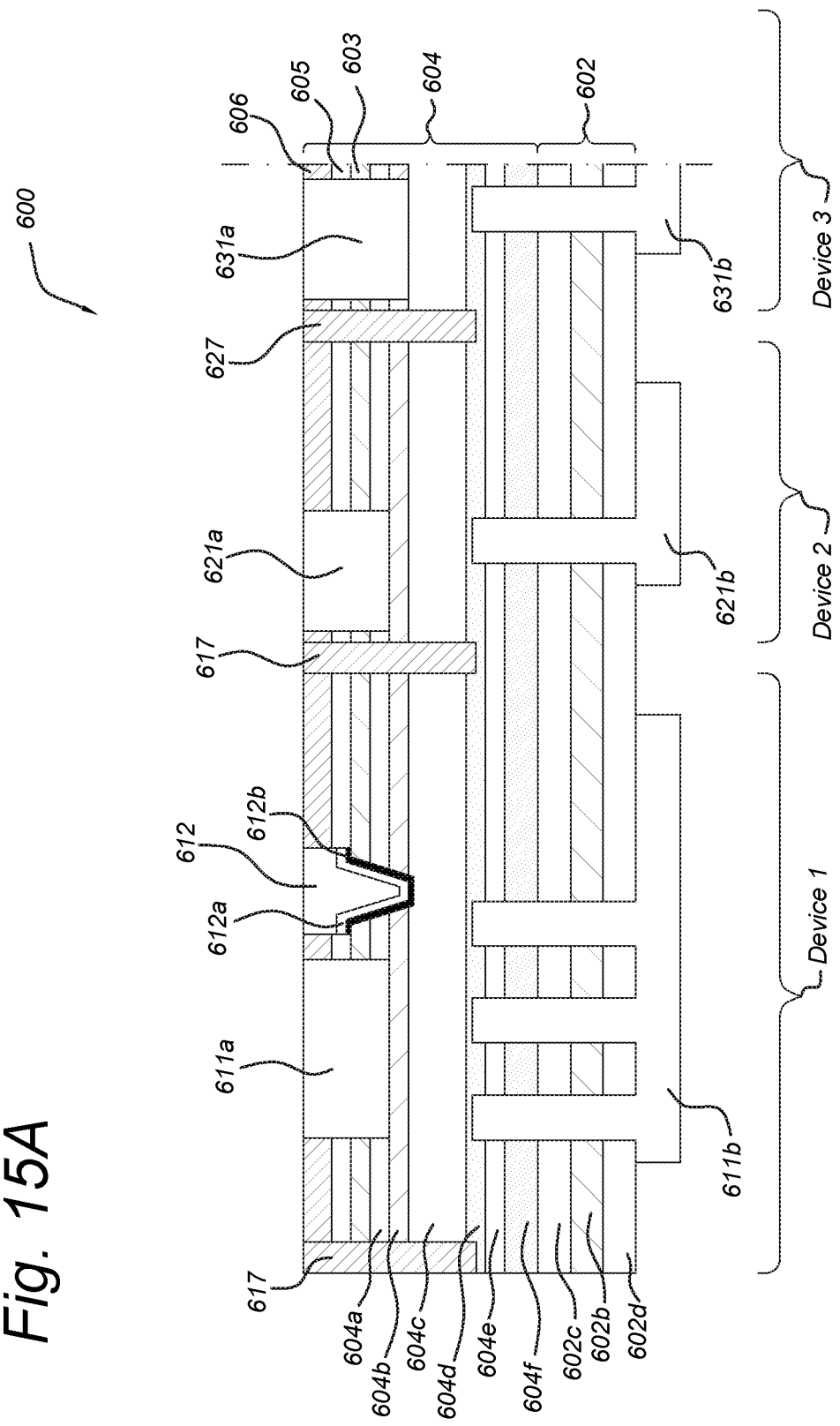
FIG. 15A depicts a cross-sectional view of an example vertical power device.

In FIGS. 15A-B, the vertical power device 600 comprises a first vertical device isolation structure 617 that isolates the first vertical III-N device from the second vertical III-N device. The third vertical III-N device is isolated from the first and second vertical III-N devices by a second vertical device isolation structure 627. As shown in FIGS. 15A-B, the first vertical device isolation structure 617 and/or the second vertical isolation structure 627 are formed extending from the top of the vertical power device 600 to the lower layer 604d. In the embodiment shown in FIG. 15A-B, the first, second, and third bottom contacts 611b, 621b, 631b are electrically connected through the lower layer 604d, i.e. the vertical devices share a common drain.

The vertical power devices according to the disclosure, e.g. the vertical power devices 100, 200, 300, 400, 500, 600 described above, can be integrated into vertical power systems, comprising an electrical power circuit and one or more of the vertical power devices, connected to other components via the respective top and bottom contacts. In embodiments, multiple ones of the vertical power devices may be arranged adjacent to each other, such that their top, resp. bottom contacts may be easily interconnected by means of interconnects on the top, resp. bottom side of the vertical power system.

The vertical power system may be one of a rectifier, attenuator, switch, or inverter, wherein a rectifier may be one of a half-bridge rectifier, full-bridge rectifier, half-wave rectifier, or full-wave rectifier.

Furthermore, the vertical power system may be a three-phase system, such as a three-phase rectifier, three-phase attenuator, three-phase switch, or three-phase inverter, wherein the three-phase rectifier may be one of a three-phase half-bridge rectifier, three-phase full-bridge rectifier, three-phase half-wave rectifier or three-phase full-wave rectifier. Such a three-phase system may comprise at least three same vertical power devices according to the present disclosure arranged in a side-by-side relationship.

Figure 6:
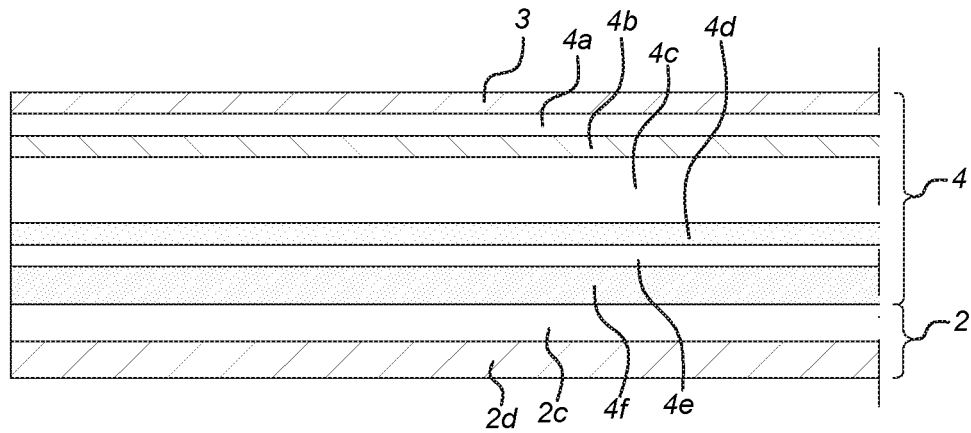
FIG. 6 depicts a step in an example process flow for manufacturing a vertical power device.

Embodiments of a process flow for manufacturing vertical power devices 100, 200, 300, 400, 500, 600 of FIGS. 1-5 and 15 according to the disclosure will be described with reference to FIGS. 6-14. FIG. 6 shows a substrate 2 comprising substrate layers 2c-2d (in the finished vertical power devices 100, 200, 300, 400, 500, 600, this corresponds to substrates 102, 202, 302, 402, 502, 602), wherein a III-N device stack 4 comprising III-N layers 4a-4f (in the finished vertical power devices 100, 200, 300, 400, 500, 600 this corresponds to III-N device stacks 104, 204, 304, 404, 504, 604) is formed on top of the substrate 2 and a first passivation layer 3 (in the finished vertical power devices 100, 200, 300, 400, 500, 600, this corresponds to first passivation layers 103, 203, 303, 403, 503, 603) is formed on top of the III-N device stack 4.

Figure 7:
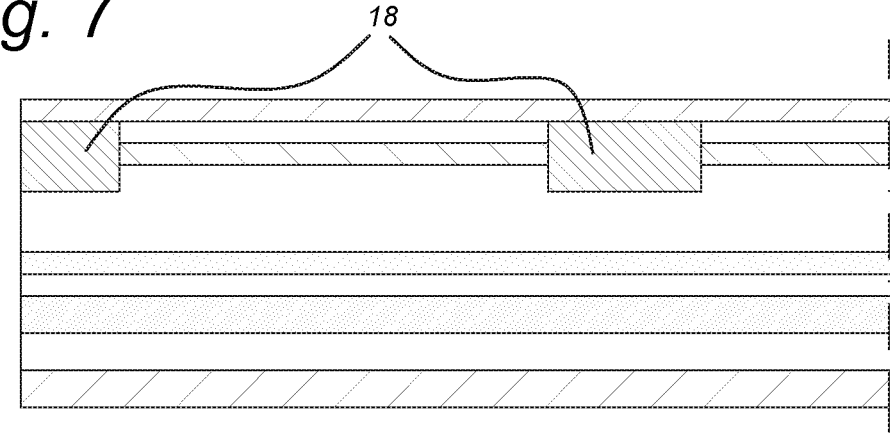
FIG. 7 depicts another step in the example process flow for manufacturing a vertical power device.

FIG. 7 shows the substrate 2, III-N device stack 4, and passivation layer 3 which may be formed on top of each other as described above, wherein a first via isolation region 18 is formed (in the finished vertical power devices 300, 400, 500, 600, this corresponds to first via isolation regions 318, 418, 518, 618), which is known in the art as a shallow recess isolation structure or an implant isolation structure. This first via isolation region 18 is formed in at least the upper layer 4a and the body layer 4b. Processes for forming the first via isolation region 18 are known in the art, such as, trench isolation by recessing through at least the upper and body layers 4a, 4b or implant isolation.

Figure 8:
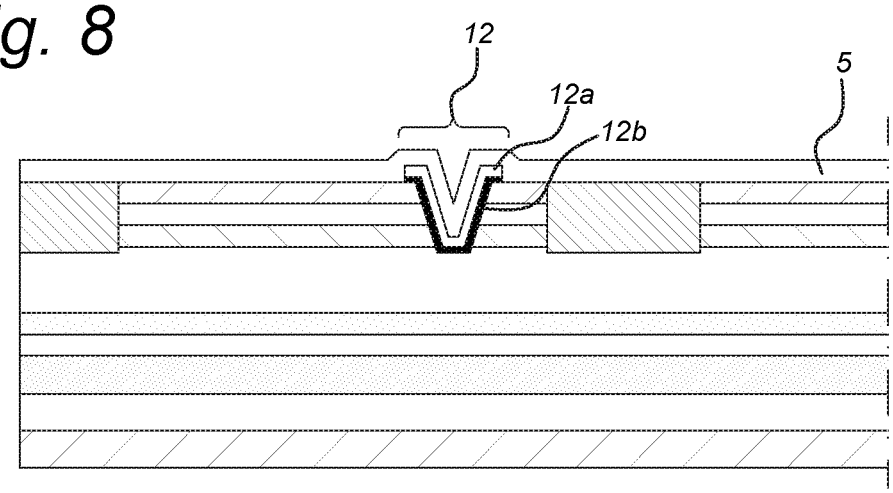
FIG. 8 depicts another step in the example process flow for manufacturing a vertical power device.

FIG. 8 shows the result of steps of forming at least one gate 12 (in the finished vertical power devices 100, 200, 300, 400, 500, 600, this corresponds to gates 112, 122, 212, 312, 322, 412, 422, 512, 612) in the III-N device stack 4, comprising gate dielectric 12b and gate electrode 12a. Processes for forming the gate 12 are known in the art and may, for example, comprise etching and deposition steps. A second passivation layer 5 (in the finished vertical power devices 100, 200, 300, 400, 500, 600, this corresponds to second passivation layers 105, 205, 305, 405, 505, 605) may be formed on the first passivation layer 3 and the gates 12. A process for forming the second passivation layer 5 is known in the art and may, for example, comprise a deposition step.

Figure 9:
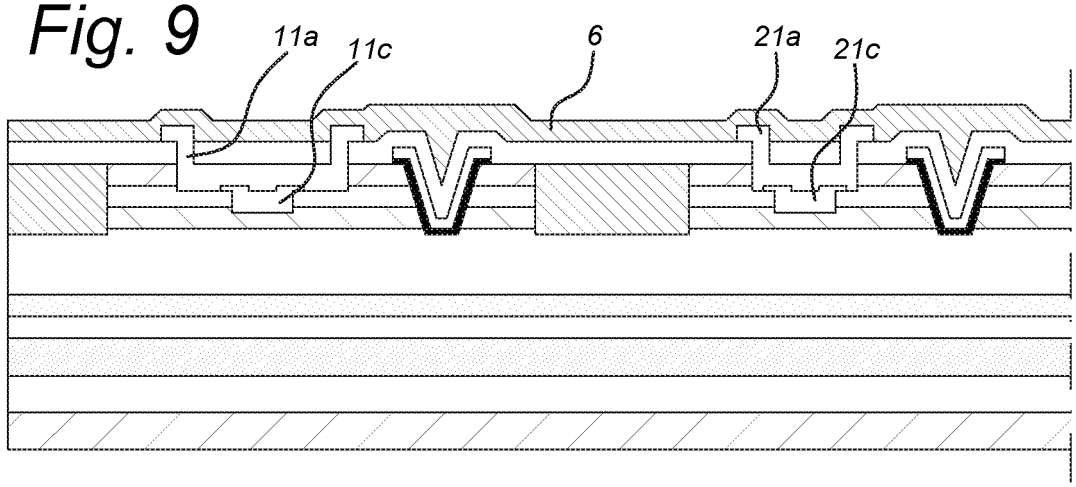
FIG. 9 depicts another step in the example process flow for manufacturing a vertical power device.

FIG. 9 shows the result of forming first and second top contacts 11a, 21a (in the finished vertical power devices 100, 200, 300, 400, 500, 600, this corresponds to first and second top contacts 111a, 121a, 221a, 221a, 311a, 321a, 411a, 421a, 511a, 521a, 621a) in the III-N device stack 4, particularly in at least the upper layer 4a, possibly also in the body layer 4b, possibly also partly in the lower layer 4c. A first and second body contact 11c, 21c may be formed on the body layer 4b, wherein the relative top contact 11a, 21a is formed on the upper layer 4a. The body contact 11c, 21c is electrically connected to the relative top contact 11a, 21a. Processes for forming the top contacts are known in the art and may, for example, comprise etch and deposition steps. Furthermore, a third passivation layer 6 (in the finished vertical power devices 300, 400, 500, this corresponds to third passivation layers 306, 406, 506) may be formed atop the second passivation layer 5. A process for forming the third passivation layer 6 is known in the art and may, for example, comprise a deposition step.

Figure 10:
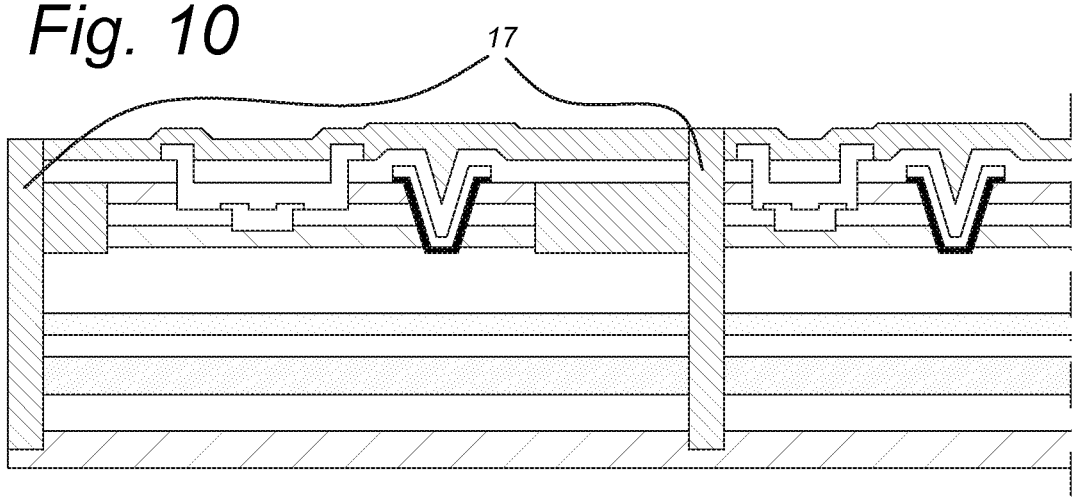
FIG. 10 depicts another step in the example process flow for manufacturing a vertical power device.

FIG. 10 shows the result of forming a first vertical device isolation structure 17 (in the finished vertical power devices 100, 200, 300, 400, 500, 600, this corresponds to first vertical device isolation structures 117, 217, 317, 417, 517, 617) as a deep trench isolation module by recessing through at least the III-N device stack 4 and possibly (as shown) at least partly through the substrate 2. In particular, the first vertical device isolation structure 17 may extend through at least the III-N device stack 4 as described in the first embodiment. The first vertical device isolation structure 17 may be further extended in at least one layer of the substrate 2 and/or at least one of the passivation layers 3, 5, 6 as described in herein. Furthermore, the first vertical device isolation structure 17 may be formed adjacent to or partially in the first via isolation region 18.

Figure 11:
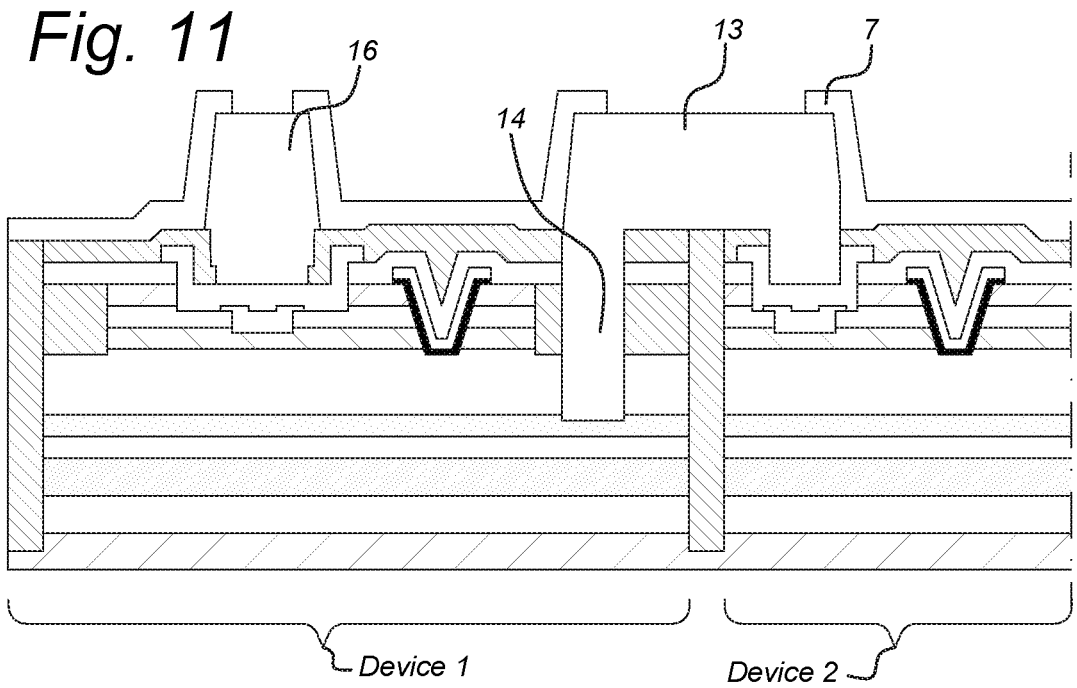
FIG. 11 depicts another step in the example process flow for manufacturing a vertical power device.

FIG. 11 shows the result of forming a vertical deep via 14 (in the finished vertical power devices 300, 400, 500 this corresponds to vertical deep vias 314, 414, 514, 524) through the vertical device isolation structure 17, a power metal 16 (in the finished vertical power devices 300, 400, 500, this corresponds to power metals 316, 416, 516) on the first top contact 11a and a lateral interconnect 13 (in the finished vertical power devices 300, 400, 500, this corresponds to first, resp. second lateral interconnect 313, 413, 513, 523) on the second top contact 21a and extending over the first vertical device isolation structure 17. Processes for forming these structures are known in the art and may, for example, comprise etch and deposition steps. Furthermore, a fourth passivation layer 7 (in the finished vertical power devices 300, 400, 500, this corresponds to first vertical device isolation structures 307, 407, 507) may be formed on the third passivation layer 6 and partially over the power metal 16 and the first lateral interconnect 13. A process for forming the third passivation layer 7 is known in the art and may, for example, comprise a deposition step.

Figure 12:
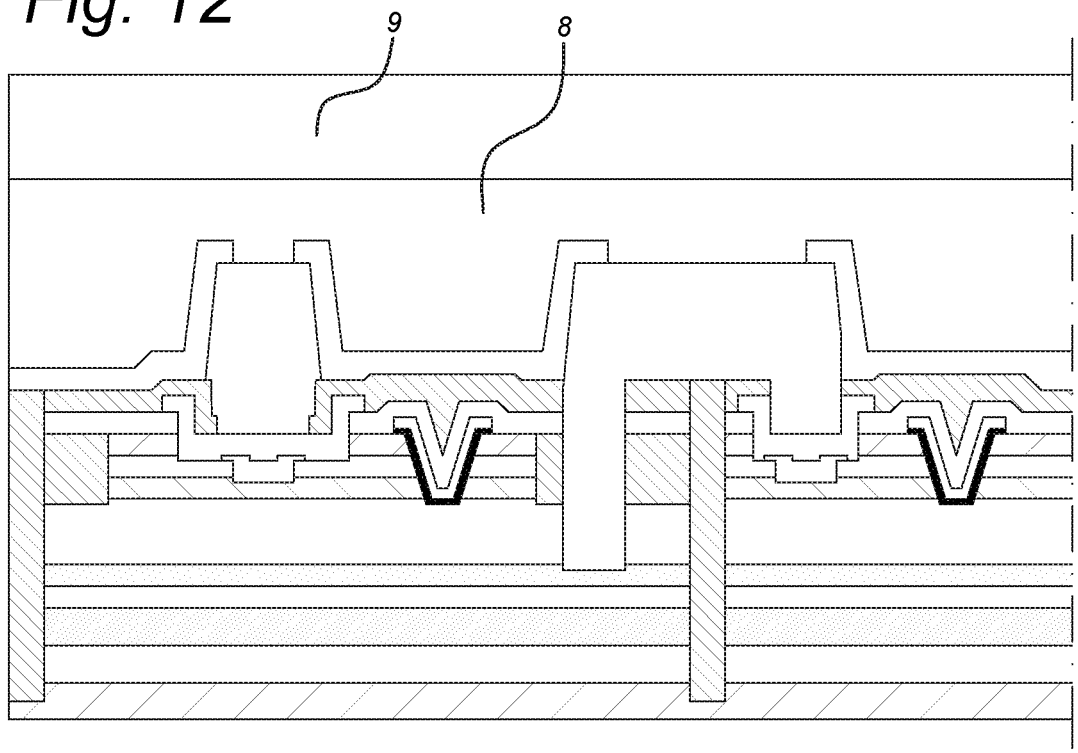
FIG. 12 depicts another step in the example process flow for manufacturing a vertical power device.

FIG. 12 shows that a temporary bonding layer 8 may be provided on the top side. The temporary bonding layer 8 may be provided for temporarily bonding the structure formed in the preceding steps to a temporary bonding substrate 9. The temporary bonding layer 8 may comprise an adhesive known in the art such as a thermoplastic adhesive (removable high-temperature spin-on adhesive), thermoset adhesive, low temperature waxes, hydrocarbon oligomers and polymers, acrylates, epoxy, silicones, etc. The temporary bonding may reduce the risk of breaks and other damage of the formed structure in subsequent processing steps.

Figure 13:
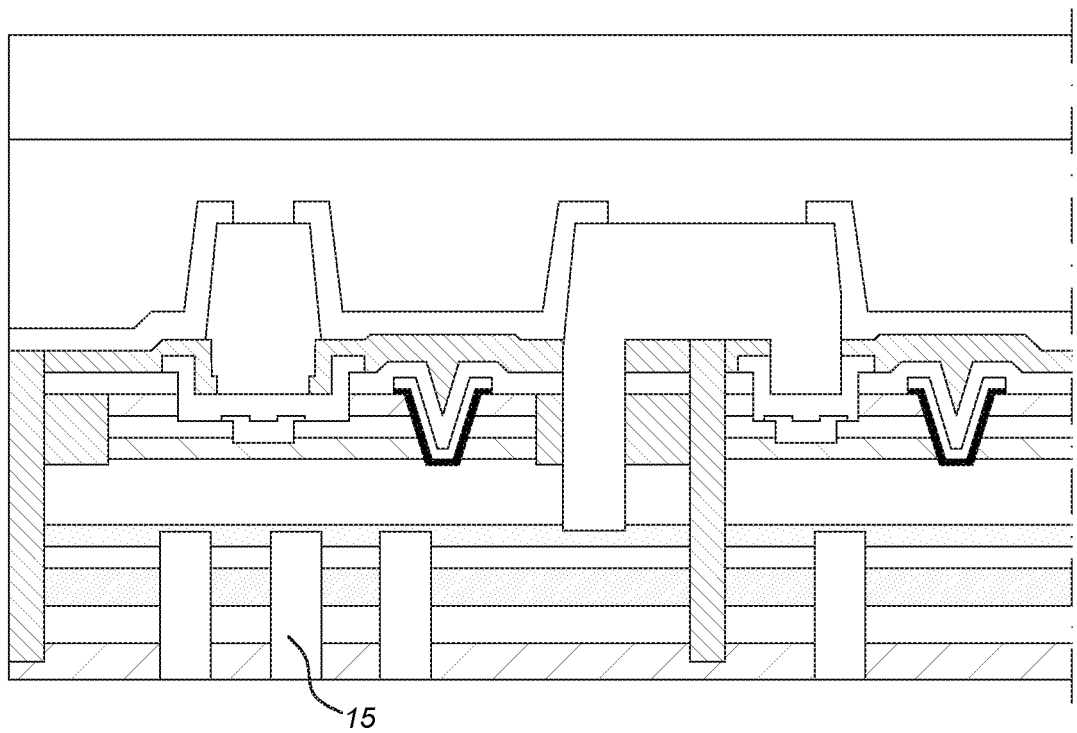
FIG. 13 depicts another step in the example process flow for manufacturing a vertical power device.

FIG. 13 shows the step of recessing in the bottom side of the structure formed in the preceding steps to form vias 15 extending from the bottom side up through at least part of the substrate 2, particularly through the handling layer 2d, carrier layer 2c, nucleation layer 2b and the buffer layer 2a, an in some examples up to the lower layer 4d of the III-N stack 4. The vias 15 are provided for allowing a first and second bottom power metal to be formed in a subsequent step.

Figure 14:
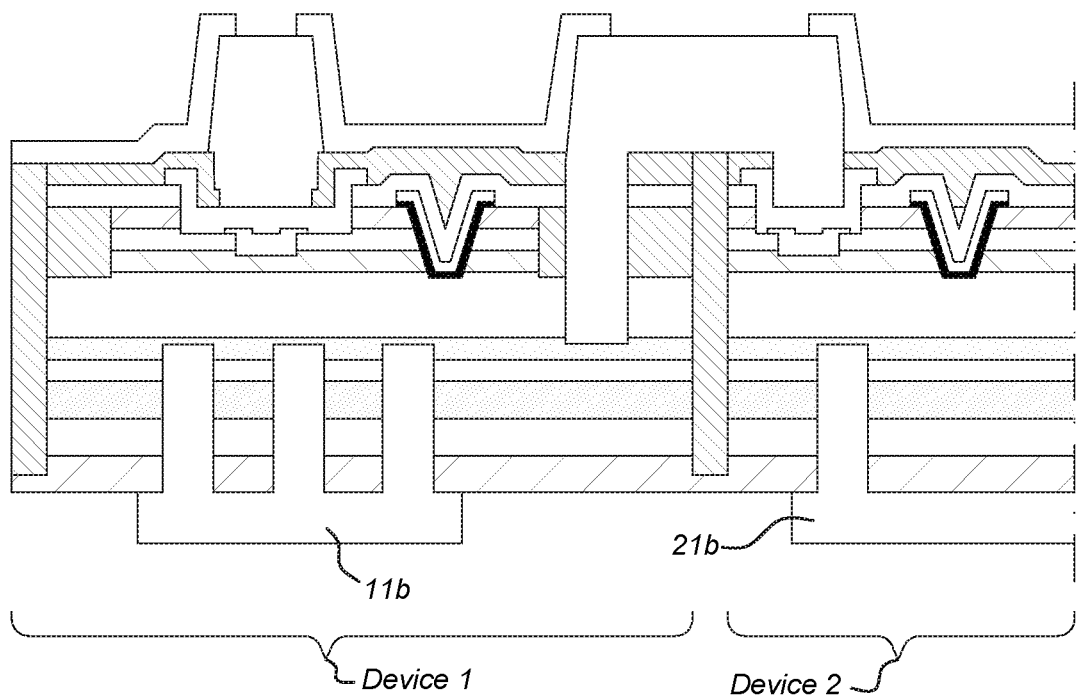
FIG. 14 depicts another step in the example process flow for manufacturing a vertical power device.

FIG. 14 shows a finished vertical power device according to the present disclosure, after formation of the bottom contacts 11b, 21b in the previously formed vias 15. Gate contacts for applying voltages to the gates 12 are formed in a different plane from the cross-section shown in FIG. 14 and are therefore not visible in this Figure. The applied power metal may extend to the outside of the bottom side of the vertical power device, thereby electrically connecting the metal in a number of the vias 15 and forming the first bottom contact 11b and the second bottom contact 21b. An additional passivation layer (not shown) may be formed on the substrate 2 on the bottom side of the vertical power device 1, thereby partially covering the first and second bottom contacts 11b, 21b. The additional passivation layer may be provided for isolating the first bottom contact 11b from the second bottom contact 21b. The additional passivation layer may further protect the bottom contacts 11b, 21b from environmental influences.

What is claimed is:

1. A vertical power device having a top side and a bottom side, the vertical power device comprising:
   a substrate;
   a group III-Nitride based device stack formed on the substrate, the group III-Nitride based device stack comprising a body layer of a first conduction type between a lower layer of a second conduction type and an upper layer of the second conduction type, wherein the body layer, the lower layer, and the upper layer each comprise a group III-Nitride material;
   a passivation layer;
   a first vertical group III-Nitride based device and a second vertical group III-Nitride based device formed in the group III-Nitride based device stack, wherein the first vertical group III-Nitride based device and the second vertical group III-Nitride based device form an electrical connection, the first vertical group III-Nitride based device comprising a first top contact and a first bottom contact, and the second vertical group III-Nitride based device comprising a second top contact and a second bottom contact, the first top contact and the second top contact being formed at the top side to pass through the passivation layer and be exposed at the top side, the first bottom contact and the second bottom contact being formed at the bottom side to pass through the substrate and be exposed at the bottom side, and the first bottom contact comprising two vias that are vertically aligned with the first top contact and that pass through the substrate; and
   a first vertical device isolation structure that isolates the first vertical group III-Nitride based device from the second vertical group III-Nitride based device.

2. The vertical power device according to claim 1, wherein the electrical connection of the first vertical group III-Nitride based device and the second vertical group III-Nitride based device comprises:
   a first vertical deep via extending from the top side up to at least the lower layer of the group III-Nitride based device stack; and
   a first via isolation region isolating the first vertical deep via from the first top contact, the upper layer, and the body layer, the first via isolation region being provided around the first vertical deep via in at least the upper layer and the body layer.

3. The vertical power device according to claim 1, wherein the substrate comprises an insulating layer, and wherein the first vertical device isolation structure extends from the top side to the insulating layer within the substrate.

4. The vertical power device according to claim 2, wherein the electrical connection of the first vertical group III-Nitride based device and the second vertical group III-Nitride based device further comprises a lateral interconnect formed at the top side over the first vertical device isolation structure, wherein the first vertical deep via electrically connects the lateral interconnect and at least the lower layer, and wherein the first via isolation region further isolates the lateral interconnect.

5. The vertical power device according to claim 4, wherein the first vertical deep via extends from the lateral interconnect to the first bottom contact, such that the first and second vertical group III-Nitride based devices are connected in series.

6. The vertical power device according to claim 2, wherein the first vertical deep via is formed adjacent to the first vertical device isolation structure.

7. The vertical power device according to claim 1, wherein at least one of the first top contact or the second top contact is formed on the upper layer, and wherein a body contact is connected to the at least one of the first top contact or the second top contact formed on the upper layer, the body contact being formed on the body layer.

8. The vertical power device according to claim 1, wherein the first vertical group III-Nitride based device and the second vertical group III-Nitride based device are connected in parallel.

9. The vertical power device according to claim 1, wherein the vertical power device further comprises a third vertical group III-Nitride based device that is electrically connected to the second vertical group III-Nitride based device and isolated by a second vertical device isolation structure.

10. The vertical power device according to claim 9, wherein each of the first vertical group III-Nitride based device, the second vertical group III-Nitride based device, and the third vertical group III-Nitride based device is one of a thyristor, a transistor, a power diode, or a Schottky diode.

11. A vertical power system comprising at least one of an inverter, a half-bridge rectifier, a full-bridge rectifier, a half-wave rectifier, or a full-wave rectifier that includes a vertical power device, the vertical power device comprising:
   a substrate;
   a group III-Nitride based device stack formed on the substrate, the group III-Nitride based device stack comprising a body layer of a first conduction type between a lower layer of a second conduction type and an upper layer of the second conduction type, wherein the body layer, the lower layer, and the upper layer each comprise a group III-Nitride material;
   a passivation layer;
   a first vertical group III-Nitride based device and a second vertical group III-Nitride based device formed in the group III-Nitride based device stack, wherein the first vertical group III-Nitride based device and the second vertical group III-Nitride based device form an electrical connection, the first vertical group III-Nitride based device comprising a first top contact and a first bottom contact, and the second vertical group III-Nitride based device comprising a second top contact and a second bottom contact, the first top contact and the second top contact being formed at a top side of the vertical power device to pass through the passivation layer and be exposed at the top side, and the first bottom contact and the second bottom contact being formed at a bottom side of the vertical power device to pass through the substrate and be exposed at the bottom side, and the first bottom contact comprising two vias that are vertically aligned with the first top contact and that pass through the substrate; and a first vertical device isolation structure that isolates the first vertical group III-Nitride based device from the second vertical group III-Nitride based device.

12. A process for fabricating a vertical power device, the process comprising:

providing a substrate;

forming a group III-Nitride based device stack on the substrate, the group III-Nitride based device stack comprising a body layer of a first conduction type between a lower layer of a second conduction type and an upper layer of the second conduction type, wherein the body layer, the lower layer, and the upper layer each comprise a group III-Nitride material;

forming a passivation layer;

forming a first vertical group III-Nitride based device and a second vertical group III-Nitride based device in the group III-Nitride based device stack, wherein the first vertical group III-Nitride based device and the second vertical group III-Nitride based device form an electrical connection, the first vertical group III-Nitride based device comprising a first top contact and a first bottom contact, and the second vertical group III-Nitride based device comprising a second top contact and a second bottom contact, the first top contact and the second top contact being formed at a top side of the vertical power device to pass through the passivation layer and be exposed at the top side, and the first bottom contact and the second bottom contact being formed at a bottom side of the vertical power device to pass through the substrate and be exposed at the bottom side, and the first bottom contact comprising two vias that are vertically aligned with the first top contact and that pass through the substrate; and forming a first vertical device isolation structure that isolates the first vertical group III-Nitride based device from the second vertical group III-Nitride based device.

13. The process according to claim 12, further comprising forming an electrical connection between the first vertical group III-Nitride based device and the second vertical group III-Nitride based device by (i) forming a first vertical deep via extending from the top side up to at least the lower layer of the group III-Nitride based device stack and (ii) forming a first via isolation region around the first vertical deep via in at least the upper layer and the body layer, thereby isolating the first vertical deep via from the first top contact, the upper layer, and the body layer.

14. The process according to claim 12, wherein the substrate comprises an insulating layer, and wherein forming the first vertical device isolation structure comprises forming the first vertical device isolation structure extending from the top side to the insulating layer within the substrate.

15. The process according to claim 13, wherein forming the electrical connection between the first vertical group III-Nitride based device and the second vertical group III-Nitride based device further comprises forming a lateral interconnect at the top side over the first vertical device isolation structure, wherein the first vertical deep via electrically connects the lateral interconnect and at least the lower layer, and wherein the first via isolation region further isolates the lateral interconnect.

16. The process according to claim 15, wherein forming the first vertical deep via comprises forming the first vertical deep via extending from the lateral interconnect to the first bottom contact, such that the first and second vertical group III-Nitride based devices are connected in series.

17. The process according to claim 13, wherein forming the first vertical deep via comprises forming the first vertical deep via adjacent to the first vertical device isolation structure.

18. The vertical power device of claim 1, wherein the second bottom contact comprises a via that is vertically aligned with the second top contact and that passes through the substrate.

19. The vertical power device of claim 1, wherein a first doping concentration of the upper layer is substantially equal to a second doping concentration of the lower layer.

20. The vertical power device of claim 11, wherein the second bottom contact comprises a via that is vertically aligned with the second top contact and that passes through the substrate.

* * * * *